(12) United States Patent
Lim et al.

(10) Patent No.: US 11,145,351 B2
(45) Date of Patent: Oct. 12, 2021

(54) SEMICONDUCTOR DEVICES

(71) Applicant: SK hynix Inc., Icheon-si (KR)

(72) Inventors: Jung Ho Lim, Seoul (KR); Byeong Chan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/983,690

(22) Filed: Aug. 3, 2020

(65) Prior Publication Data
US 2021/0142848 A1 May 13, 2021

Related U.S. Application Data

(63) Continuation-in-part of application No. 16/846,042, filed on Apr. 10, 2020.

(30) Foreign Application Priority Data

Nov. 7, 2019 (KR) .......................... 10-2019-0142088

(51) Int. Cl.
*G11C 11/406* (2006.01)
(52) U.S. Cl.
CPC .................. *G11C 11/40626* (2013.01); *G11C 2211/4062* (2013.01)
(58) Field of Classification Search
CPC ................. G11C 11/40626; G11C 2211/4062
USPC .................................................. 365/201, 222
See application file for complete search history.

(56) References Cited

U.S. PATENT DOCUMENTS

| 7,143,329 | B1 | 11/2006 | Trimberger et al. | |
|---|---|---|---|---|
| 8,588,017 | B2 | 11/2013 | Park et al. | |
| 10,613,928 | B2 | 4/2020 | Kim et al. | |
| 10,922,170 | B2 | 2/2021 | Kim et al. | |
| 2002/0051397 | A1* | 5/2002 | Watanabe | G11C 7/222 365/222 |
| 2004/0243886 | A1 | 12/2004 | Klein | |
| 2006/0117155 | A1* | 6/2006 | Ware | G11C 8/06 711/163 |

(Continued)

FOREIGN PATENT DOCUMENTS

| KR | 100667784 B1 | 1/2007 |
|---|---|---|
| KR | 1020170056823 A | 5/2017 |
| KR | 1020190063123 A | 6/2019 |

*Primary Examiner* — Michael T Tran
(74) *Attorney, Agent, or Firm* — William Park & Associates Ltd.

(57) ABSTRACT

A semiconductor device includes an error check and scrub (ECS) command generation circuit and an ECS control circuit. The ECS command generation circuit is configured to generate an ECS command by controlling a speed of a first counting operation that is performed based on a refresh command or a bank refresh command, according to a temperature and a refresh mode of the semiconductor device, or is configured to generate the ECS command by performing a second counting operation based on a periodic signal. The ECS control circuit is configured to sequentially generate an ECS active command, an ECS read command, an ECS write command, an ECS pre-charge command, and an end signal based on the ECS command. The refresh mode includes a fine granularity refresh (FGR) mode, and the temperature includes a high temperature that is a temperature above a certain temperature.

21 Claims, 31 Drawing Sheets

(56) References Cited

U.S. PATENT DOCUMENTS

| | | | |
|---|---|---|---|
| 2006/0285412 A1* | 12/2006 | Hummler | G06F 11/106 |
| | | | 365/222 |
| 2007/0038919 A1* | 2/2007 | Sekiguchi | G06F 11/1044 |
| | | | 714/763 |
| 2008/0092016 A1* | 4/2008 | Pawlowski | G06F 11/1044 |
| | | | 714/764 |
| 2008/0109705 A1* | 5/2008 | Pawlowski | H03M 13/151 |
| | | | 714/767 |
| 2011/0126073 A1* | 5/2011 | Nieuwland | G11C 7/22 |
| | | | 714/752 |
| 2014/0068319 A1* | 3/2014 | Daly | G11C 7/1006 |
| | | | 714/6.2 |
| 2016/0026533 A1 | 1/2016 | Ishikawa | |
| 2017/0060681 A1* | 3/2017 | Halbert | G06F 11/1068 |
| 2017/0161143 A1* | 6/2017 | Reed | G11C 11/4093 |
| 2019/0179560 A1* | 6/2019 | Moon | G06F 3/0619 |

* cited by examiner

FIG.7

| Data Rate (Mbps) | tCCD (nck) | tDLLK (nck) |
|---|---|---|
| 2000 ~ 3200 | 8 | 1024 |
| 3201 ~ 3600 | 9 | 1024 |
| 3601 ~ 4000 | 10 | 1280 |
| 4001 ~ 4400 | 11 | 1280 |
| 4401 ~ 4800 | 12 | 1536 |
| 4801 ~ 3200 | 13 | 1536 |

SEMICONDUCTOR DEVICES

CROSS-REFERENCE TO RELATED APPLICATIONS

This application is a continuation-in-part of U.S. patent application Ser. No. 16/846,042, filed on Apr. 10, 2020, which claims the priority of Korean Patent Application No. 10-2019-0142088, filed on Nov. 7, 2019 in the Korean Intellectual Property Office.

BACKGROUND

1. Technical Field

Embodiments of the present disclosure relate to semiconductor devices correcting errors of memory cells.

2. Related Art

Recently, a DDR2 scheme or a DDR3 scheme receiving and outputting four-bit data or eight-bit data during each clock cycle time has been used to improve an operation speed of semiconductor devices. If a data transmission speed of the semiconductor devices becomes faster, probability of occurring errors may increase while the data are transmitted in the semiconductor devices. Accordingly, advanced design schemes have been proposed to guarantee the reliability of the data transmission.

When the data are transmitted in semiconductor devices, an error check code which is capable of detecting occurrence of errors may be generated and transmitted with the data to guarantee the reliability of data transmission. The error check code may include an error detection code (EDC) which is capable of detecting errors and an error correction code (ECC) which is capable of correcting the errors by itself.

SUMMARY

According to an embodiment, a semiconductor device includes an error check and scrub (ECS) command generation circuit and an ECS control circuit. The ECS command generation circuit is configured to generate an ECS command by controlling a speed of a first counting operation that is performed based on a refresh command or a bank refresh command, according to a temperature and a refresh mode of the semiconductor device, or the ECS command generation circuit is configured to generate the ECS command by performing a second counting operation based on a periodic signal. The ECS control circuit is configured to sequentially generate an ECS active command, an ECS read command, an ECS write command, an ECS pre-charge command, and an end signal based on the ECS command. The refresh mode includes a fine granularity refresh (FGR) mode, and the temperature includes a high temperature that is a temperature above a certain temperature.

According to another embodiment, a semiconductor device includes an error check and scrub (ECS) command generation circuit and an ECS control circuit. The ECS command generation circuit is configured to generate an ECS command by controlling a speed of a counting operation performed based on a refresh command or a bank refresh command, according to a temperature and a refresh mode of the semiconductor device. The ECS control circuit is configured to sequentially generate an ECS active command, an ECS read command, an ECS write command, an ECS pre-charge command, and an end signal based on the ECS command. The refresh mode includes a fine granularity refresh (FGR) mode, and the temperature includes a high temperature over a certain temperature.

According to another embodiment, a semiconductor device includes a fine granularity refresh (FGR) command generation circuit configured to generate an FGR command when all bit signals of the refresh command or the bank refresh command are generated in an FGR mode, a pre-count flag generation circuit configured to generate a pre-count flag when the refresh command is generated in a non-FGR mode or when the FGR command is generated '2M' times in the FGR mode, a count flag generation circuit configured to generate a count flag when the pre-count flag is generated at a low temperature, the low temperature being below a certain temperature, or when the pre-count flag is generated '2N' times at a high temperature, the high temperature being above the certain temperature, an external error check and scrub (ECS) command generation circuit configured to count the count flag to generate an external ECS command, and an ECS command selection circuit configured to output the external ECS command as an ECS command for controlling an ECS operation based on a command selection signal. The numbers 'M' and 'N' are natural numbers.

According to yet another embodiment, a semiconductor device includes an error check and scrub (ECS) command generation circuit configured to generate an ECS command by performing a counting operation based on a periodic signal, and an ECS control circuit configured to sequentially generate an ECS active command, an ECS read command, an ECS write command, an ECS pre-charge command, and an end signal based on the ECS command.

BRIEF DESCRIPTION OF THE DRAWINGS

FIG. 7 is a table illustrating speed flags that are used in the ECS control circuit of FIG. 6.

DETAILED DESCRIPTION OF THE EMBODIMENTS

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal having a first voltage correspond to a signal with a logic "high" level, a signal having a second voltage correspond to a signal with a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
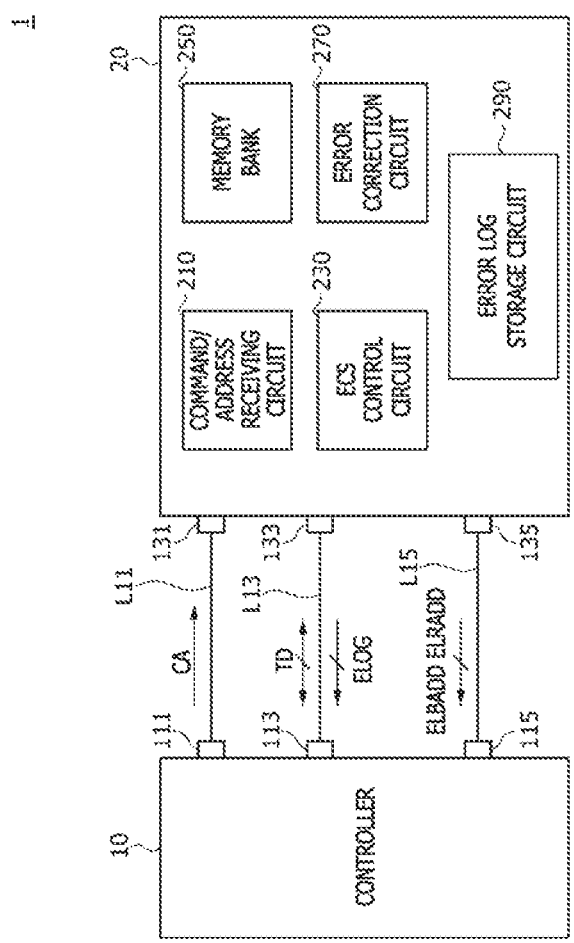
FIG. 1 is a block diagram, illustrating a configuration of a semiconductor system, according to an embodiment of the present disclosure.

As illustrated in FIG. 1, a semiconductor system 1 according to an embodiment may include a controller 10 and a semiconductor device 20. The semiconductor device 20 may include a command/address receiving circuit 210, an error check and scrub (ECS) control circuit 230, a memory bank 250, an error correction circuit 270, and an error log storage circuit 290.

The controller 10 may include a first control pin 111, a second control pin 113, and a third control pin 115. The semiconductor device 20 may include a first semiconductor pin 131, a second semiconductor pin 133, and a third semiconductor pin 135. The first control pin 111 may be connected to the first semiconductor pin 131 through a first transmission line L11. The second control pin 113 may be connected to the second semiconductor pin 133 through a second transmission line L13. The third control pin 115 may be connected to the third semiconductor pin 135 through a third transmission line L15. The controller 10 may transmit a command/address signal CA to the semiconductor device 20 through the first transmission line L11 in order to control the semiconductor device 20. The controller 10 may receive transmission data TD from the semiconductor device 20 through the second transmission line L13 or may output the transmission data TD to the semiconductor device 20 through the second transmission line L13. The semiconductor device 20 may transmit an error log signal ELOG to the controller 10 through the second transmission line L13. The semiconductor device 20 may transmit an error log bank address ELBADD and an error log row address ELRADD to the controller 10 through the third transmission line L15. A configuration and an operation of the controller 10 will be described in more detail with reference to FIG. 14.

The command/address receiving circuit 210 may receive the command/address signal CA for executing various internal operations through the first transmission line L11. The various internal operations may include a read operation, a write operation, and a refresh operation. The command/address signal CA may include a command and an address. The command/address receiving circuit 210 may be inactivated to stop an operation for receiving the command/address signal CA when an ECS operation is performed. In the present embodiment, the ECS operation may be automatically performed when a refresh command has a value which is equal to or greater than a predetermined value. Because the command/address receiving circuit 210 is inactivated during the ECS operation, it may be possible to reduce power consumption of the semiconductor device 20 and to prevent malfunction of the semiconductor device 20 from occurring due to the command/address signal CA inputted to the command/address receiving circuit 210.

The ECS control circuit 230 may control the ECS operation based on the refresh command. The ECS operation may include an ECS read operation, an ECS error correction operation, and an ECS write operation. The ECS control circuit 230 may control the memory bank 250 and the error correction circuit 270 such that a codeword outputted from the memory bank 250 is transmitted to the error correction circuit 270 when the ECS read operation is performed. The codeword may include data and a parity. The parity may be generated from the data using an error correction code (ECC). When the ECS error correction operation is performed, the ECS control circuit 230 may control the error correction circuit 270 such that the error correction circuit 270 checks an error of the codeword outputted from the memory bank 250 and corrects the error of the codeword to generate a corrected codeword. When the corrected codeword is generated during the ECS error correction operation, the ECS control circuit 230 may control the memory bank 250 and the error correction circuit 270 such that the corrected codeword is stored in the memory bank 250 through the ECS write operation. When the corrected codeword is not generated during the ECS error correction operation, the ECS write operation is not performed. The ECS control circuit 230 may control the error log storage circuit 290 such that the error log storage circuit 290 stores information on the number of the errors after the ECS operations of all of the memory cells included in the memory bank 250 are performed. The ECS control circuit 230 may control the error log storage circuit 290 to compare the numbers of the errors of all of row paths with each other and to store information on the maximum number of the errors and information on a row path having the maximum number of the errors when the ECS operations of all of the memory cells included in the memory bank 250 are performed. The row path may mean at least one word line, which is activated during an active operation, among a plurality of word lines connected to the memory cells included in the memory bank 250.

The memory bank 250 may include a plurality of memory cells, and at least one of the plurality of memory cells may be selected by an address during the read operation, the ECS read operation, the write operation, the ECS write operation, and the refresh operation. The memory bank 250 may output the data included in a codeword stored in the memory cells selected by an address as the transmission data TD through the second transmission line L13 when the read operation is performed. The memory bank 250 may output the codeword stored in the memory cells selected by an address to the error correction circuit 270 when the ECS read operation is performed. The number of bits included in the data included in a codeword outputted from the memory bank 250 during the read operation and the ECS read operation may be set according to a burst length. The memory bank 250 may store a codeword in memory cells selected by an address when the write operation is performed. The memory bank 250 may store a corrected codeword generated by the error correction circuit 270 in memory cells selected by an address when the ECS write operation is performed. The number of bits included in data or corrected data included in the codeword stored in the memory bank 250 during the write operation and the ECS write operation may be set according to a burst length. The memory bank 250 may periodically restore the data of memory cells which are selected by an address when the refresh operation is performed.

The error correction circuit 270 may receive a codeword including data and a parity, which are stored in memory cells selected by an address, to detect an error of the codeword when the read operation or the ECS read operation is performed. The error correction circuit 270 may correct an error of the codeword to generate a corrected codeword when the error is detected from the codeword inputted to the error correction circuit 270 during the read operation or the ECS read operation. The error correction circuit 270 may generate an error flag (EFLAG of FIG. 2) to transmit the error flag EFLAG to the error log storage circuit 290 when the error of the codeword is detected during the ECS read operation. When the ECS write operation is performed, the error correction circuit 270 may store the corrected codeword in memory cells selected by an address. When the write operation is performed, the error correction circuit 270 may transmit the corrected codeword to the controller 10.

The error log storage circuit 290 may extract and store information on the numbers of the errors of the row paths, information on the maximum number of the errors, and information on a row path having the maximum number of the errors based on the error flag EFLAG when the ECS operations of all of the memory cells included in the memory bank 250 are sequentially performed. The error log storage circuit 290 may transmit the information on the numbers of the errors of the row paths, the information on the maximum number of the errors, and the information on a row path having the maximum number of the errors to the controller 10 through the second and third transmission lines L13 and L15 when an error log command (ELC of FIG. 2) is generated.

Figure 2:
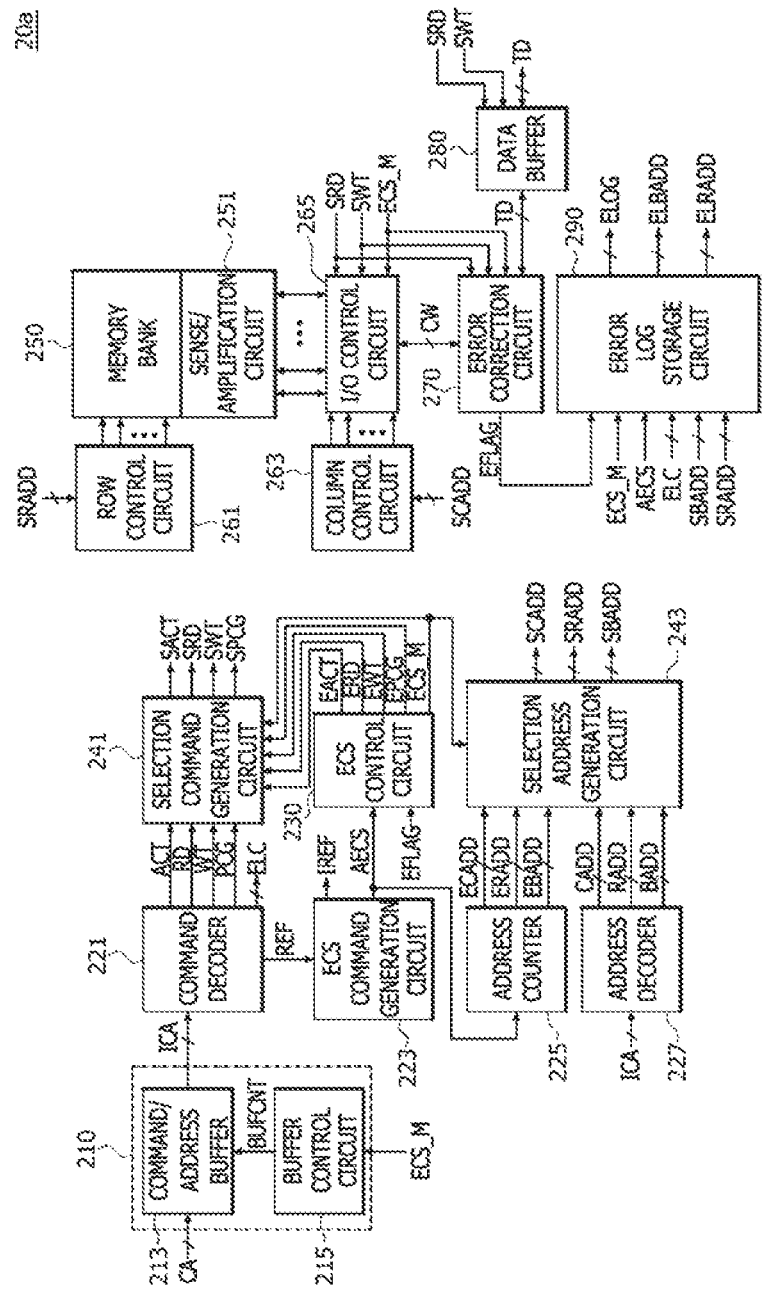
FIG. 2 is a block diagram, illustrating an example of a semiconductor device, included in the semiconductor system of FIG. 1.

FIG. 2 is a block diagram illustrating a configuration of a semiconductor device 20a corresponding to an example of the semiconductor device 20 included in the semiconductor system 1. The semiconductor device 20a may include the command/address receiving circuit 210, a command decoder 221, an ECS command generation circuit 223, an address counter 225, an address decoder 227, the ECS control circuit 230, a selection command generation circuit 241, a selection address generation circuit 243, the memory bank 250, a sense/amplification circuit 251, a row control circuit 261, a column control circuit 263, an I/O control circuit 265, the error correction circuit 270, a data buffer 280, and the error log storage circuit 290.

The command/address receiving circuit 210 may include a command/address buffer 213 and a buffer control circuit 215. The command/address buffer 213 may buffer the command/address signal CA received through the first transmission line L11 to generate an internal command/address signal ICA. The buffer control circuit 215 may generate a buffer control signal BUFCNT based on an ECS mode signal ECS_M when the ECS operation is performed. The command/address buffer 213 may receive the buffer control signal BUFCNT generated by the buffer control circuit 215 and may buffer the command/address signal CA to stop an operation for generating the internal command/address signal ICA when the ECS operation is performed. The number of bits included in the command/address signal CA and the internal command/address signal ICA may be set to be different according to the embodiments.

The command decoder 221 may decode the internal command/address signal ICA to generate a refresh command REF, an active command ACT, a read command RD, a write command WT, a pre-charge command PCG, and the error log command ELC. The refresh command REF may be generated to perform the refresh operation. The active command ACT may be generated to perform the active operation. The read command RD may be generated to perform the read operation. The write command WT may be generated to perform the write operation. The pre-charge command PCG may be generated to perform a pre-charge operation. The error log command ELC may be generated to store the number of memory cells storing a codeword including an error based on the error flag EFLAG and may be generated to store a selection bank address SBADD and a selection row address SRADD for selecting a row path having the maximum number of errors.

The ECS command generation circuit 223 may generate an ECS command AECS and an internal refresh command IREF based on the refresh command REF. The ECS command generation circuit 223 may generate the ECS command AECS when the refresh command REF is generated a certain number of times, corresponding to a predetermined set value. The ECS command generation circuit 223 may generate the internal refresh command IREF based on the refresh command REF when the ECS command AECS is not generated. For example, when the predetermined set value is a natural number 'K' which is equal to or more than two, the ECS command generation circuit 223 may generate the internal refresh command IREF until the refresh command REF is generated 'K−1' times and may generate the ECS command AECS when the refresh command REF is generated 'K' times. A configuration and an operation of the ECS command generation circuit 223 will be described in more detail with reference to FIGS. 3 and 4.

The address counter 225 may generate an ECS column address ECADD, an ECS row address ERADD, and an ECS bank address EBADD based on the ECS command AECS. The address counter 225 may count the ECS command AECS to control a logic level combination of the ECS column address ECADD, a logic level combination of the ECS row address ERADD, and a logic level combination of the ECS bank address EBADD. The number of bits included in each of the ECS column address ECADD, the ECS row address ERADD, and the ECS bank address EBADD may be set to be different according to the embodiments. The address counter 225 may count the ECS command AECS to sequentially increase a binary number corresponding to a logic level combination of bits included in the ECS column address ECADD, to sequentially increase a binary number corresponding to a logic level combination of bits included in the ECS row address ERADD, and to sequentially increase a binary number corresponding to a logic level combination of bits included in the ECS bank address EBADD. When each of the ECS column address ECADD, the ECS row address ERADD, and the ECS bank address EBADD includes two bits, the sequential increase of the logic level combination of each of the ECS column address ECADD, the ECS row address ERADD, and the ECS bank address EBADD may mean that the logic level combination of each of the ECS column address ECADD, the ECS row address ERADD, and the ECS bank address EBADD changes in order of '00', '01', '10', and '11. A configuration and an operation of the address counter 225 will be described in more detail with reference to FIG. 8.

The address decoder 227 may decode the internal command/address signal ICA to generate a column address CADD, a row address RADD, and a bank address BADD. The address decoder 227 may decode the internal command/address signal ICA to generate the column address CADD, the row address RADD, and the bank address BADD used for the internal operations including the active operation, the read operation, and the write operation.

The ECS control circuit 230 may generate the ECS mode signal ECS_M based on the ECS command AECS. The ECS mode signal ECS_M may be generated during a period that the ECS operation is performed. The ECS control circuit 230 may generate an ECS active command EACT, an ECS read command ERD, an ECS write command EWT, an ECS pre-charge command EPCG, and an ECS end command (ECS_END of FIG. 5) while the ECS operation is performed. The ECS control circuit 230 may count an internal clock signal (ICLK of FIG. 5) based on the error flag EFLAG to sequentially generate the ECS active command EACT, the ECS read command ERD, the ECS write command EWT, and the ECS pre-charge command EPCG while the ECS operation is performed. For example, the ECS control circuit 230 may generate the ECS active command EACT when the internal clock signal ICLK generated by the ECS command AECS is counted three times, may generate the ECS read command ERD when the internal clock signal ICLK is counted five times, may generate the ECS write command EWT when the internal clock signal ICLK is counted seven times, and may generate the ECS pre-charge command EPCG when the internal clock signal ICLK is counted ninth times. The number of times that the internal clock signal ICLK is counted to generate each of the ECS active command EACT, the ECS read command ERD, the ECS write command EWT, and the ECS pre-charge command EPCG may be set to be different according to the embodiments. When no error detects from a codeword outputted from the memory cells during the ECS error correction operation not to generate the error flag EFLAG, the ECS control circuit 230 does not generate the ECS write command EWT. A configuration and an operation of the ECS control circuit 230 will be described in more detail with reference to FIGS. 5 to 7.

The selection command generation circuit 241 may generate a selection active command SACT, a selection read command SRD, a selection write command SWT, and a selection pre-charge command SPCG from the active command ACT, the read command RD, the write command WT, the pre-charge command PCG, the ECS active command EACT, the ECS read command ERD, the ECS write command EWT, and the ECS pre-charge command EPCG based on the ECS mode signal ECS_M. The selection generation circuit 241 may select and output the ECS active command EACT, the ECS read command ERD, the ECS write command EWT, and the ECS pre-charge command EPCG as the selection active command SACT, the selection read command SRD, the selection write command SWT, and the selection pre-charge command SPCG while the ECS operation is performed. The selection command generation circuit 241 may select and output the active command ACT, the read command RD, the write command WT, and the pre-charge command PCG as the selection active command SACT, the selection read command SRD, the selection write command SWT, and the selection pre-charge command SPCG while the ECS operation is not performed. A configuration and an operation of the selection command generation circuit 241 will be described in more detail with reference to FIG. 9.

The selection address generation circuit 243 may generate a selection column address SCADD, a selection row address SRADD, and a selection bank address SBADD from the ECS column address ECADD, the ECS row address ERADD, the ECS bank address EBADD, the column address CADD, the row address RADD, and the bank address BADD based on the ECS mode signal ECS_M. The selection address generation circuit 243 may select and output the ECS column address ECADD, the ECS row address ERADD, and the ECS bank address EBADD as the selection column address SCADD, the selection row address SRADD, and the selection bank address SBADD while the ECS operation is performed. The selection address generation circuit 243 may select and output the column address CADD, the row address RADD, and the bank address BADD as the selection column address SCADD, the selection row address SRADD, and the selection bank address SBADD while the ECS operation is not performed. A configuration and an operation of the selection address generation circuit 243 will be described in more detail with reference to FIG. 10.

The memory bank 250 may include a plurality of memory cells, and each of the memory cells may be coupled to any one of word lines and any one of bit lines. One of the word lines connected to the memory cells included in the memory bank 250 may be selected by the selection row address SRADD. At least one of the bit lines connected to the memory cells included in the memory bank 250 may be selected by the selection column address SCADD. At least one of the memory cells may be accessed by selecting one of the word lines and at least one of the bit lines. The number of the word lines coupled to the memory cells included in the memory bank 250 and the number of the bit lines coupled to the memory cells included in the memory bank 250 may be set to be different according to the embodiments. A configuration and an operation of the memory bank 250 will be described in more detail with reference to FIG. 11. Although the present embodiment describes in conjunction with a case that the ECS operation is performed for the memory cells included in only the memory bank 250 selected by the selection bank address SBADD for the purpose of ease and convenience in explanation, the present disclosure is not limited thereto. For example, in some other embodiments, the semiconductor device 20a may be realized such that the ECS operation is performed for memory cells included in one of a plurality of memory banks, which is selected by the selection bank address SBADD.

The sense/amplification circuit 251 may include a plurality of sense amplifiers (not shown). The sense amplifiers included in the sense/amplification circuit 251 may be connected to the memory cells included in the memory bank 250 and may sense and amplify levels of data signals loaded on the bit lines.

The row control circuit 261 may select one of the word lines coupled to the memory cells included in the memory bank 250 as a row path based on the selection row address SRADD. The row control circuit 261 may perform the active operation for loading a codeword stored in the memory cells in a row path selected by the selection row address SRADD on the bit lines such that the sense/amplification circuit 251 senses and amplifies data signals of the codeword.

The column control circuit 263 may control the I/O control circuit 265 such that the codeword is inputted to or outputted from the sense amplifiers selected by the selection column address SCADD among the plurality of sense amplifiers coupled to the memory cells in the row path. The column control circuit 263 may control the I/O control circuit 265 such that the read operation and the write operation are performed for the memory cells coupled to the sense amplifiers selected by the selection column address SCADD among the plurality of memory cells included in a memory bank performing the active operation.

The I/O control circuit 265 may be coupled between the sense/amplification circuit 251 and the error correction circuit 270 to control input or output of a codeword based on the selection read command SRD, the selection write command SWT, and the ECS mode signal ECS_M. The I/O control circuit 265 may output a codeword CW including data and a parity outputted from the memory bank 250 to the error correction circuit 270 during the read operation or the ECS read operation. The I/O control circuit 265 may output the codeword CW received from the error correction circuit 270 to the memory bank 250 during the write operation or the ECS write operation.

The error correction circuit 270 may receive the codeword CW from the I/O control circuit 265 or may output the codeword CW to the I/O control circuit 265 based on the selection read command SRD, the selection write command SWT, and the ECS mode signal ECS_M. The error correction circuit 270 may receive the transmission data TD from the data buffer 280 or may output the transmission data TD to the data buffer 280 based on the selection read command SRD, the selection write command SWT, and the ECS mode signal ECS_M. The error correction circuit 270 may generate the error flag EFLAG based on the codeword CW. When the read operation is performed, the error correction circuit 270 may receive the codeword CW from the I/O control circuit 265 and may decode the codeword CW to generate the error flag EFLAG and to output data included in the codeword CW corrected by the error correction circuit 270 as the transmission data TD through the data buffer 280 if an error is detected from the codeword CW. When the write operation is performed, the error correction circuit 270 may encode the transmission data TD received from the data buffer 280 to generate the codeword CW including data and a parity and may transmit the codeword CW to the I/O control circuit 265 to store the codeword CW in the memory bank 250. When the ECS read operation is performed, the error correction circuit 270 may receive the codeword CW from the I/O control circuit 265 and may decode the codeword CW to generate the error flag EFLAG and the codeword CW corrected by the error correction circuit 270 if an error is detected from the codeword CW. The error correction circuit 270 may generate the corrected codeword CW during the ECS read operation, and the error correction circuit 270 may transmit the corrected codeword CW to the I/O control circuit 265 to store the corrected codeword CW in the memory bank 250 during the ECS write operation. A configuration and an operation of the error correction circuit 270 will be described in more detail with reference to FIG. 12.

The data buffer 280 may receive the transmission data TD from the error correction circuit 270 or may output the transmission data TD to the error correction circuit 270 based on the selection read command SRD and the selection write command SWT. The data buffer 280 may receive the transmission data TD from the controller (10 of FIG. 1) or may output the transmission data TD to the controller (10 of FIG. 1) based on the selection read command SRD and the selection write command SWT. When the write operation is performed, the data buffer 280 may transmit the transmission data TD received through the second transmission line (L13 of FIG. 1) to the error correction circuit 270. When the read operation is performed, the data buffer 280 may transmit the transmission data TD received from the error correction circuit 270 to the controller 10 through the second transmission line L13.

The error log storage circuit 290 may generate an error log signal ELOG, an error log row address ELRADD, and an error log bank address ELBADD based on the error flag EFLAG, the ECS mode signal ECS_M, the ECS command AECS, the error log command ELC, the selection row address SRADD, and the selection bank address SBADD. The error log storage circuit 290 may output information on the number of errors detected based on the error flag EFLAG as the error log signal ELOG when the ECS operations are performed for all of the memory cells included in the memory bank 250. When the ECS operations are performed for all of the memory cells included in the memory bank 250, the error log storage circuit 290 may compare the numbers of the errors of all of the row paths with each other based on the error flag EFLAG, the selection row address SRADD, and the selection bank address SBADD to output information on the maximum number of the errors as the error log signal ELOG and to output information on the row path having the maximum number of the errors as the error log row address ELRADD and the error log bank address ELBADD. The error log storage circuit 290 may transmit the error log signal ELOG to the controller 10 through the second transmission line L13. The error log storage circuit 290 may transmit the error log row address ELRADD and the error log bank address ELBADD to the controller 10 through the third transmission line L15. A configuration and an operation of the error log storage circuit 290 will be described in more detail with reference to FIG. 13.

Figure 3:
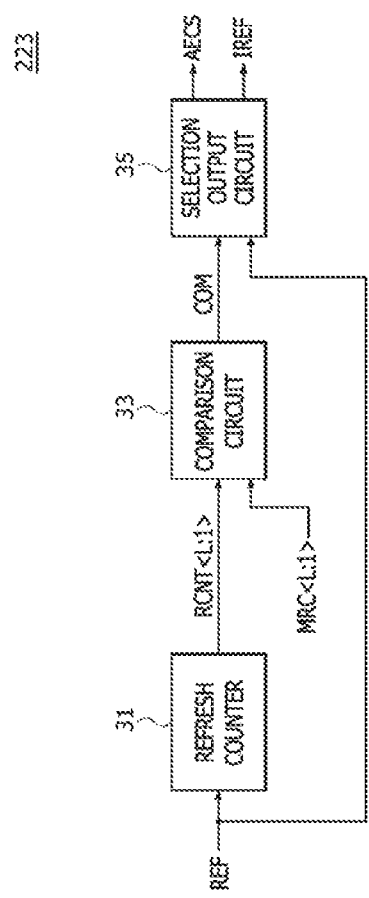
FIG. 3 is a block diagram, illustrating an example of an error check and scrub (ECS) command generation circuit, included in the semiconductor device of FIG. 2.

FIG. 3 is a block diagram illustrating an ECS command generation circuit 223 included in the semiconductor device 20*a*. As illustrated in FIG. 3, the ECS command generation circuit 223 may include a refresh counter 31, a comparison circuit 33, and a selection output circuit 35.

The refresh counter 31 may count the refresh command REF to generate a refresh count signal RCNT<L:1>. The refresh counter 31 may increase a logic level combination of bits included in the refresh count signal RCNT<L:1> when the refresh command REF is inputted to the refresh counter 31. The number "L" of bits included in the refresh count signal RCNT<L:1> may be set to be a natural number which is equal to or greater than two. For example, when the number "L" is set to be two, a logic level combination of the refresh count signal RCNT<L:1> may change to increase in order of '00', '01', '10', and '11 when the refresh command REF is inputted to the refresh counter 31. In the refresh count signal RCNT<2:1> having two bits, the logic level combination of '01' means that the second bit RCNT<2> of the refresh count signal RCNT<2:1> has a logic "low" level and the first bit RCNT<1> of the refresh count signal RCNT<2:1> has a logic "high" level.

The comparison circuit 33 may compare the refresh count signal RCNT<L:1> with a set signal MRC<L:1> to generate a comparison signal COM. The comparison circuit 33 may generate the comparison signal COM, a logic level of which is determined according to whether a logic level combination of the refresh count signal RCNT<L:1> is identical to a logic level combination of the set signal MRC<L:1>. The comparison signal COM may be generated to have a first logic level when a logic level combination of the refresh count signal RCNT<L:1> is identical to a logic level combination of the set signal MRC<L:1> and to have a second logic level when a logic level combination of the refresh count signal RCNT<L:1> is different from a logic level combination of the set signal MRC<L:1>. The set signal MRC<L:1> may have a logic level combination corresponding to the set value and may be stored in a mode register by a mode register set (MRS). In the present embodiment, the first logic level may be set as a logic "high" level, and second logic level may be set as a logic "low" level.

The selection output circuit 35 may generate the ECS command AECS and the internal refresh command IREF based on the comparison signal COM and the refresh command REF. The selection output circuit 35 may output the refresh command REF as the ECS command AECS when the comparison signal COM is generated to have the first logic level because the refresh count signal RCNT<L:1> and the set signal MRC<L:1> have the same logic level combination. The selection output circuit 35 may output the refresh command REF as the internal refresh command IREF when the comparison signal COM is generated to have the second logic level because the refresh count signal RCNT<L:1> and the set signal MRC<L:1> have different logic level combinations.

Figure 4:
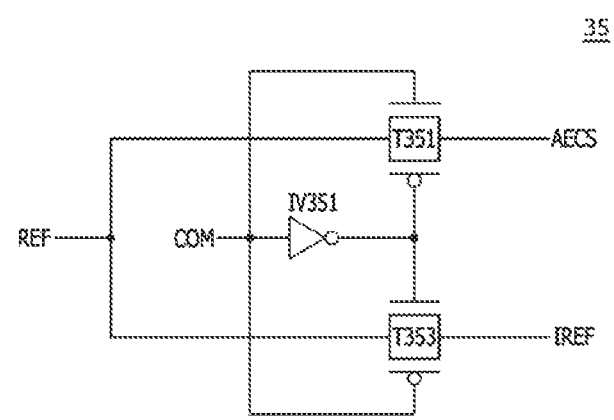
FIG. 4 is a circuit diagram, illustrating an example of a selection output circuit, included in the ECS command generation circuit of FIG. 3.

FIG. 4 is a circuit diagram illustrating the selection output circuit 35 included in the ECS command generation circuit 223. As illustrated in FIG. 4, the selection output circuit 35 may include an inverter IV351 and transfer gates T351 and T353. The inverter IV351 may inversely buffer the comparison signal COM to output the inversely buffered signal of the comparison signal COM. The transfer gate T351 may be turned on to output the refresh command REF as the ECS command AECS when the comparison signal COM has a logic "high" level. The transfer gate T351 may be turned on to output the refresh command REF as the internal refresh command IREF when the comparison signal COM has a logic "low" level.

Figure 5:
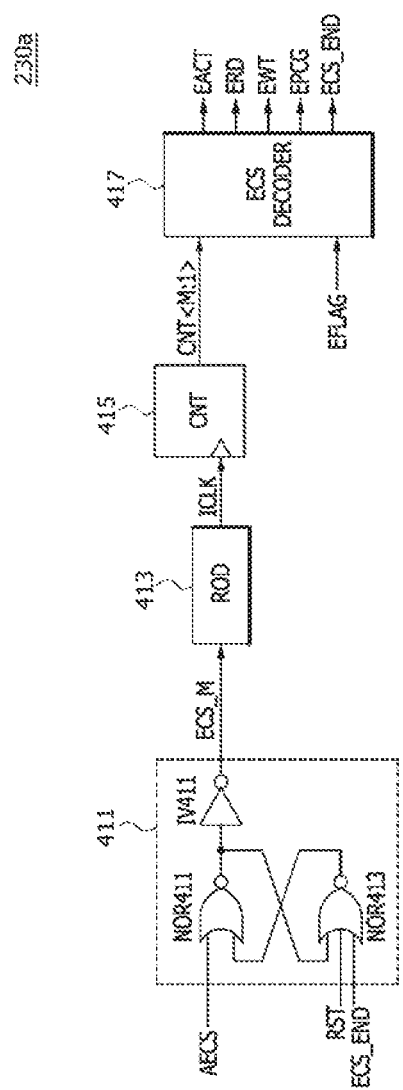
FIG. 5 illustrates an example of an ECS control circuit that is included in the semiconductor device of FIG. 2.

FIG. 5 illustrates an ECS control circuit 230*a* corresponding to an example of the ECS control circuit 230 included in the semiconductor device 20*a*. As illustrated in FIG. 5, the ECS control circuit 230*a* may include an ECS mode signal generation circuit 411, an internal clock generation circuit 413, an ECS counter 415, and an ECS decoder 417.

The ECS mode signal generation circuit 411 may include NOR gates NOR411 and NOR413 and an inverter IV411. The NOR gate NOR411 may receive the ECS command AECS and an output signal of the NOR gate NOR413 to perform a logical NOR operation of the ECS command AECS and the output signal of the NOR gate NOR413. The NOR gate NOR413 may receive a reset signal RST, the ECS end command ECS_END, and an output signal of the NOR gate NOR411 to perform a logical NOR operation of the reset signal RST, the ECS end command ECS_END, and the output signal of the NOR gate NOR411. The inverter IV411 may inversely buffer the output signal of the NOR gate NOR411 to generate the ECS mode signal ECS_M. The ECS mode signal generation circuit 411 may generate the ECS mode signal ECS_M based on the ECS command AECS, the reset signal RST, and the ECS end command ECS_END. The ECS mode signal generation circuit 411 may generate the ECS mode signal ECS_M with a logic "high" level when the ECS command AECS is generated to have a logic "high" level. The ECS mode signal generation circuit 411 may change a logic level of the ECS mode signal ECS_M from a logic "high" level to a logic "low" level when the reset signal RST or the ECS end command ECS_END is generated to have a logic "high" level. The reset signal RST may be generated to have a logic "high" level for an initialization operation of the semiconductor device 20.

The internal clock generation circuit 413 may generate the internal clock signal ICLK based on the ECS mode signal ECS_M. The internal clock generation circuit 413 may generate the internal clock signal ICLK while the ECS mode signal ECS_M has a logic "high" level. The internal clock generation circuit 413 may stop generation of the internal clock signal ICLK when the ECS mode signal ECS_M has a logic "low" level. The internal clock generation circuit 413 may include an oscillator.

The ECS counter 415 may count the internal clock signal ICLK to generate a count signal CNT<M:1>. The ECS counter 415 may be synchronized with a rising edge (or a falling edge according to the embodiments) of the internal clock signal ICLK to increase a binary number corresponding to a logic level combination of the count signal CNT<M:1>. The number "M" of bits included in the count signal CNT<M:1> may be set to be a natural number which is equal to or greater than two. For example, when the number "M" is set as four, the count signal CNT<4:1> may be counted up bit by bit to have logic level combinations of '0000', '0001', '0010', '0011', '0100', . . . , and '1111' in sequence when a logic level of the internal clock signal ICLK changes from a logic "low" level to a logic "high" level. In the count signal CNT<4:1>, the logic level combination of '0001' means that fourth to second bits CNT<4:2> of the count signal CNT<4:1> have a logic "low" level and the first bit CNT<1> of the count signal CNT<4:1> has a logic "high" level.

The ECS decoder 417 may generate the ECS active command EACT, the ECS read command ERD, the ECS write command EWT, the ECS pre-charge command EPCG, and the ECS end command ECS_END based on the count signal CNT<M:1> and the error flag EFLAG. The ECS decoder 417 may sequentially generate the ECS active command EACT, the ECS read command ERD, the ECS write command EWT, the ECS pre-charge command EPCG, and the ECS end command ECS_END according to a logic level combination of the count signal CNT<M:1>. For example, the ECS decoder 417 may generate the ECS active command EACT when the count signal CNT<M:1> has a logic level combination of '0011', may generate the ECS read command ERD when the count signal CNT<M:1> has a logic level combination of '0101', may generate the ECS write command EWT when the count signal CNT<M:1> has a logic level combination of '0111', may generate the ECS pre-charge command EPCG when the count signal CNT<M:1> has a logic level combination of '1001', and may generate the ECS end command ECS_END when the count signal CNT<M:1> has a logic level combination of '1011'. The ECS decoder 417 may stop generation of the ECS write command EWT when the error flag EFLAG is generated by an error detected from the codeword stored in the selected memory cells.

Figure 6:
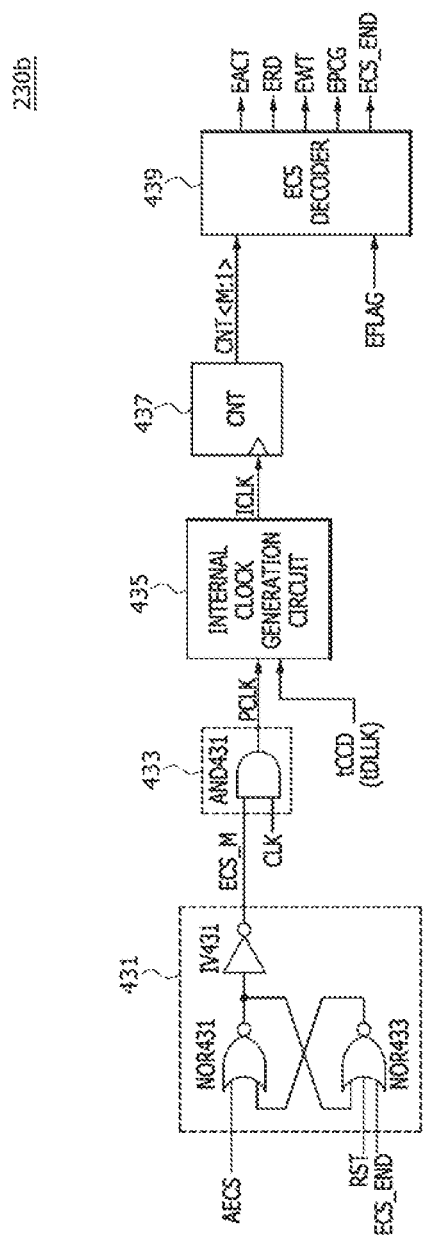
FIG. 6 illustrates another example of an ECS control circuit that is included in the semiconductor device of FIG. 2.

FIG. 6 illustrates an ECS control circuit 230b corresponding to another example of the ECS control circuit 230 included in the semiconductor device 20a. As illustrated in FIG. 6, the ECS control circuit 230b may include an ECS mode signal generation circuit 431, a pre-clock generation circuit 433, an internal clock generation circuit 435, an ECS counter 437, and an ECS decoder 439.

The ECS mode signal generation circuit 431 may include NOR gates NOR431 and NOR433 and an inverter IV431. The NOR gate NOR431 may receive the ECS command AECS and an output signal of the NOR gate NOR433 to perform a logical NOR operation of the ECS command AECS and the output signal of the NOR gate NOR433. The NOR gate NOR433 may receive the reset signal RST, the ECS end command ECS_END, and an output signal of the NOR gate NOR431 to perform a logical NOR operation of the reset signal RST, the ECS end command ECS_END, and the output signal of the NOR gate NOR431. The inverter IV431 may inversely buffer the output signal of the NOR gate NOR431 to generate the ECS mode signal ECS_M. The ECS mode signal generation circuit 431 may generate the ECS mode signal ECS_M based on the ECS command AECS, the reset signal RST, and the ECS end command ECS_END. The ECS mode signal generation circuit 431 may generate the ECS mode signal ECS_M with a logic "high" level when the ECS command AECS is generated to have a logic "high" level. The ECS mode signal generation circuit 431 may change a logic level of the ECS mode signal ECS_M from a logic "high" level to a logic "low" level when the reset signal RST or the ECS end command ECS_END is generated to have a logic "high" level.

The pre-clock generation circuit 433 may include an AND gate AND431. The pre-dock generation circuit 433 may perform a logical AND operation of the ECS mode signal ECS_M and an external clock signal CLK to generate a pre-clock signal PCLK. The external clock signal CLK may be provided by the controller (10 of FIG. 1). The pre-clock generation circuit 433 may buffer the external clock signal CLK to output the buffered signal of the external clock signal CLK as the pre-clock signal PCLK while the ECS operation is performed by the ECS mode signal ECS_M with a logic "high" level. The pre-clock generation circuit 433 may output the pre-clock signal PCLK with a logic "low" level when the ECS operation is not performed by the ECS mode signal ECS_M with a logic "low" level.

The internal clock generation circuit 435 may generate the internal clock signal ICLK based on the pre-clock signal PCLK and an operation speed flag tCCD or tDLLK. The internal clock generation circuit 435 may control a cycle of the pre-clock signal PCLK according to the speed flag tCCD or tDLLK to generate the internal clock signal ICLK. The speed flag tCCD or tDLLK may be set to be different according to a range of data rate. Referring to FIG. 7, when the data rate is within the range of 2,000 Mbps to 3,200 Mbps, the speed flag tCCD (CAS to CAS Delay period) may be set as '8' and the speed flag tDLLK (delay locked clock period) may be set as '1024'. In addition, as the data rate increases, the speed flag tCCD or tDLLK may also increase.

The internal dock generation circuit 435 may generate the internal clock signal ICLK by increasing a cycle of the pre-clock signal PCLK because a cycle of the external clock signal CLK is reduced by the speed flag tCCD or tDLLK when the data rate increases. The internal clock generation circuit 435 may generate the internal clock signal ICLK by reducing a cycle of the pre-clock signal PCLK because a cycle of the external clock signal CLK increases by the speed flag tCCD or tDLLK when the data rate decrease. Because the internal clock generation circuit 435 controls a cycle of the pre-clock signal PCLK to generate the internal clock signal ICLK even though the data rate varies, the internal clock generation circuit 435 may generate the internal clock signal ICLK having a constant cycle regardless of variation of the data rate. The internal clock generation circuit 435 may include a ring oscillator.

The ECS counter 437 may count the internal clock signal ICLK to generate the count signal CNT<M:1>. The ECS counter 437 may be synchronized with a rising edge (or a falling edge according to the embodiments) of the internal clock signal ICLK to increase a binary number corresponding to a logic level combination of the count signal CNT<M:1>.

The ECS decoder 439 may generate the ECS active command EACT, the ECS read command ERD, the ECS write command EWT, the ECS pre-charge command EPCG, and the ECS end command ECS_END based on the count signal CNT<M:1> and the error flag EFLAG. The ECS decoder 439 may sequentially generate the ECS active command EACT, the ECS read command ERD, the ECS write command EWT, the ECS pre-charge command EPCG, and the ECS end command ECS_END according to a logic level combination of the count signal CNT<M:1>.

Figure 8:
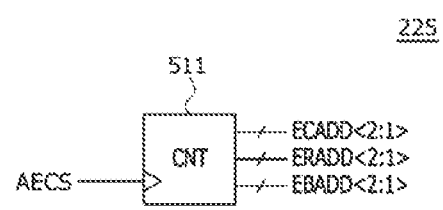
FIG. 8 illustrates an example of an address counter that is included in the semiconductor device of FIG. 2.

FIG. 8 illustrates the address counter 225 included in the semiconductor device 20a. As illustrated in FIG. 8, the address counter 225 may include a counter 511 that counts the ECS command AECS to generate the ECS column address ECADD<2:1>, the ECS row address ERADD<2:1>, and the ECS bank address EBADD<2:1>. The counter 511 may sequentially increase a logic level combination of the ECS column address ECADD<2:1>, a logic level combination of the ECS row address ERADD<2:1>, and a logic level combination of the ECS bank address EBADD<2:1> when the ECS command AECS is inputted to the counter 511. For example, when the ECS command AECS is inputted to the counter 511, the counter 511 may sequentially increase a logic level combination of the ECS column address ECADD<2:1> in order of '00', '01', '10', and '11', may sequentially increase a logic level combination of the ECS row address ERADD<2:1> in order of '00', '01', '10', and '11' after sequentially increasing the logic level combination of the ECS column address ECADD<2:1>, and may sequentially increase a logic level combination of the ECS bank address EBADD<2:1> in order of '00' and '01' after sequentially increasing the logic level combination of the ECS row address ERADD<2:1>. That is, a row path next to a certain row path may be selected after all of column paths connected to memory cells in the certain row path are sequentially selected, and a memory bank next to a certain memory bank may be selected after all of row paths included in the certain memory bank are sequentially selected. The present embodiment describes in conjunction with a case that the ECS operations are performed for only the memory cells included in the memory bank 250. In such a case, the row path may mean at least one word line, which is selected by the ECS row address ERADD, among a plurality of word lines included in the memory bank 250, and the column path may mean at least one bit line (or at least one sense amplifier), which is selected by the ECS column address ECADD, among a plurality of bit lines (or a plurality of sense amplifiers) coupled to memory cells arrayed in one row path.

Figure 9:
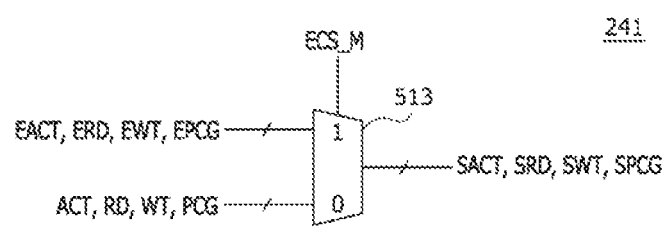
FIG. 9 illustrates an example of a selection command generation circuit that is included in the semiconductor device of FIG. 2.

FIG. 9 illustrates the selection command generation circuit 241 included in the semiconductor device 20a. As illustrated in FIG. 9, the selection command generation circuit 241 may include a command selector 513 that generates the selection active command SACT, the selection read command SRD, the selection write command SWT, and the selection pre-charge command SPCG from the active command ACT, the read command RD, the write command WT, the pre-charge command PCG, the ECS active command EACT, the ECS read command ERD, the ECS write command EWT, and the ECS pre-charge command EPCG based on the ECS mode signal ECS_M. The command selector 513 may select and output the ECS active command EACT, the ECS read command ERD, the ECS write command EWT, and the ECS pre-charge command EPCG as the selection active command SACT, the selection read command SRD, the selection write command SWT, and the selection pre-charge command SPCG during a period that the ECS operation is performed. The command selector 513 may select and output the active command ACT, the read command RD, the write command WT, and the pre-charge command PCG as the selection active command SACT, the selection read command SRD, the selection write command SWT, and the selection pre-charge command SPCG during a period that the ECS operation is not performed.

Figure 10:
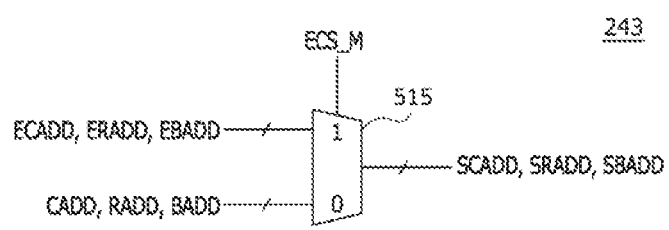
FIG. 10 illustrates an example of a selection address generation circuit that is included in the semiconductor device of FIG. 2.

FIG. 10 illustrates the selection address generation circuit 243 included in the semiconductor device 20a. As illustrated in FIG. 10, the selection address generation circuit 243 may include an address selector 515 that generates the selection column address SCADD, the selection row address SRADD, and the selection bank address SBADD from the ECS column address ECADD, the ECS row address ERADD, the ECS bank address EBADD, the column address CADD, the row address RADD, and the bank address BADD based on the ECS mode signal ECS_M. The address selector 515 may select and output the ECS column address ECADD, the ECS row address ERADD, and the ECS bank address EBADD as the selection column address SCADD, the selection row address SRADD, and the selection bank address SBADD during a period that the ECS operation is performed. The address selector 515 may select and output the column address CADD, the row address RADD, and the bank address BADD as the selection column address SCADD, the selection row address SRADD, and the selection bank address SBADD during a period that the ECS operation is not performed.

Figure 11:
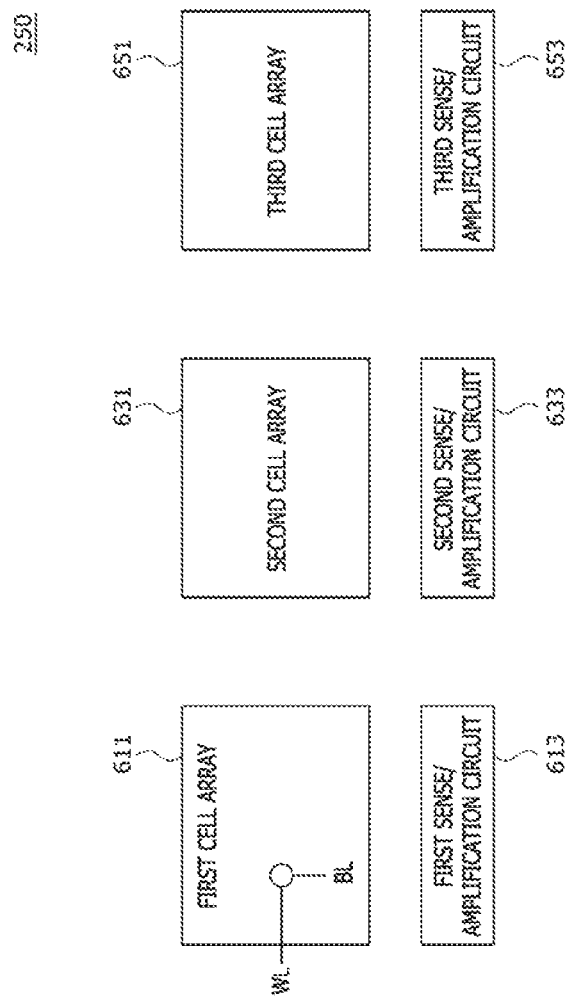
FIG. 11 is a block diagram, illustrating an example of a memory bank, included in the semiconductor device of FIG. 2.

FIG. 11 is a block diagram illustrating a configuration of the memory bank 250 included in the semiconductor device 20a. As illustrated in FIG. 11, the memory bank 250 may include a first cell array 611, a first sense/amplification circuit 613, a second cell array 631, a second sense/amplification circuit 633, a third cell array 651, and a third sense/amplification circuit 653. Each of the first, second, and third cell arrays 611, 631, and 651 may include a plurality of memory cells connected to word lines WL and bit lines BL. The number of memory cells included in each of the first, second, and third cell arrays 611, 631, and 651 may be set to be different according to the embodiments. Data and parities may be stored in each of the first, second, and third cell arrays 611, 631, and 651. Alternatively, the data or the parities may be stored in each of the first, second, and third cell arrays 611, 631, and 651. At least one the first, second, and third cell arrays 611, 631, and 651 may be used as a redundancy cell array during a repair operation for replacing erroneous memory cells with redundant memory cells in the redundancy cell array. The first sense/amplification circuit 613 may include sense amplifiers connected to the bit lines included in the first cell array 611. The second sense/amplification circuit 633 may include sense amplifiers connected to the bit lines included in the second cell array 631. The third sense/amplification circuit 653 may include sense amplifiers connected to the bit lines included in the third cell array 651.

Figure 12:
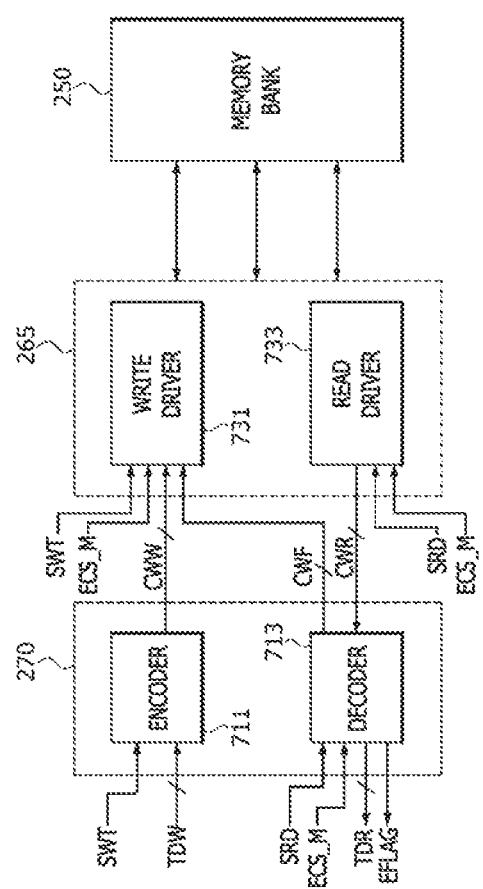
FIG. 12 is a block diagram, illustrating a memory bank, an input/output (I/O) control circuit, and an error correction circuit, included in the semiconductor device of FIG. 2.

FIG. 12 is a block diagram illustrating the memory bank 250, the I/O control circuit 265, and the error correction circuit 270 included in the semiconductor device 20a. The error correction circuit 270 may include an encoder 711 and a decoder 713. The encoder 711 may generate a write codeword CWW based on the selection write command SWT and write transmission data TDW. The decoder 713 may generate read transmission data TDR, the error flag EFLAG, and a corrected codeword CWF based on the selection read command SRD, the ECS mode signal ECS_M, and a read codeword CWR. The I/O control circuit 265 may include a write driver 731 and a read driver 733. The write driver 731 may store the write codeword CWW or the corrected codeword CWF in the memory bank 250 based on the selection write command SWT and the ECS mode signal ECS_M. The read driver 733 may transmit the read codeword CWR outputted from the memory bank 250 to the decoder 713. The write operation, the read operation, and the ECS operation of the semiconductor device 20a having the aforementioned configuration will be described hereinafter.

When the write operation is performed, the encoder 711 may encode the write transmission data TDW to generate the write codeword CWW and to transmit the write codeword CWW to the write driver 731. The write transmission data TDW may correspond to the transmission data (TD of FIG. 2) outputted from the data buffer (280 of FIG. 2) during the write operation. The encoder 711 may generate a parity from the write transmission data TDW using a Hamming code and may generate the write codeword CWW including the write transmission data TDW and the parity. The write codeword CWW may correspond to a codeword used during the write operation. The write driver 731 may store the write codeword CWW in the memory bank 250.

When the read operation is performed, the read driver 733 may transmit the read codeword CWR including the data and the parity stored in the memory bank 250 to the decoder 713. The decoder 713 may correct an error of the read codeword CWR to output corrected data as the read transmission data TDR.

When the ECS operation is performed, the read driver 733 may transmit the read codeword CWR including the data and the parity stored in the memory bank 250 to the decoder 713. The read codeword CWR may correspond to a codeword used during the read operation. The decoder 713 may correct an error of the read codeword CWR to generate the corrected codeword CWF including corrected data and a parity and to output the corrected codeword CWF to the write driver 731. The write driver 731 may store the corrected codeword CWF in the memory bank 250.

Figure 13:
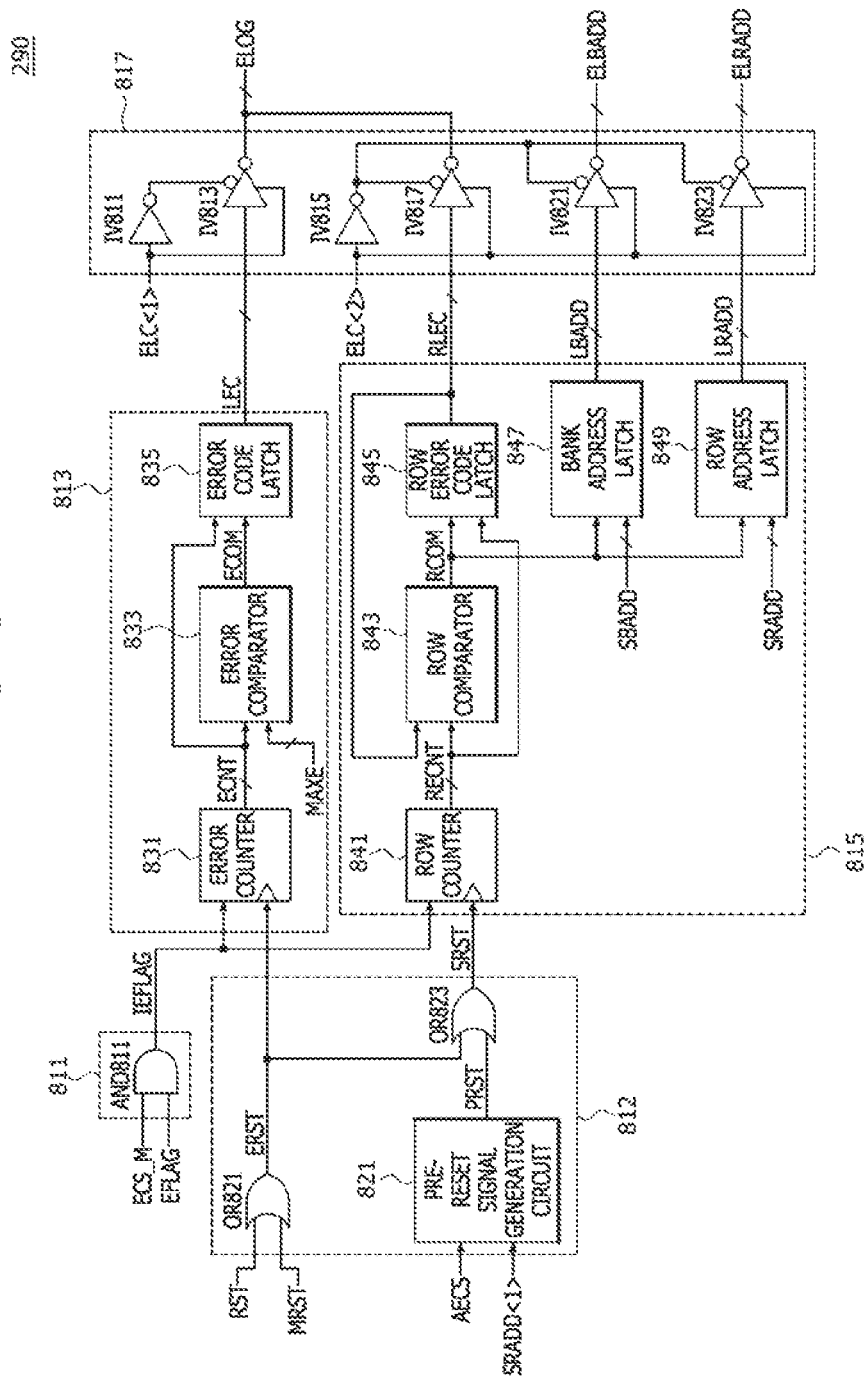
FIG. 13 illustrates an example of an error log storage circuit that is included in the semiconductor device of FIG. 2.

FIG. 13 illustrates a configuration of the error log storage circuit 290 included in the semiconductor device 20a. As illustrated in FIG. 13, the error log storage circuit 290 may include an internal error flag generation circuit 811, a selection reset signal generation circuit 812, an error log control circuit 813, a row error log control circuit 815, and an error log output circuit 817.

The internal error flag generation circuit 811 may include an AND gate AND811. The AND gate AND811 may perform a logical AND operation of the ECS mode signal ECS_M and the error flag EFLAG to generate an internal error flag IEFLAG. The internal error flag generation circuit 811 may generate the internal error flag IEFLAG with a logic "high" level when the error flag EFLAG with a logic "high" level is generated by an error detected from a codeword stored in the memory cells selected while the ECS mode signal ECS_M has a logic "high" level to perform the ECS operation.

The selection reset signal generation circuit 812 may include OR gates OR821 and OR823 and a pre-reset signal generation circuit 821. The OR gate OR821 may perform a logical OR operation of the reset signal RST and a mode register reset signal MRST to generate an error reset signal ERST. The OR gate OR821 may generate the error reset signal ERST with a logic "high" level when the reset signal RST or the mode register reset signal MRST is generated to have a logic "high" level. The mode register reset signal MRST may be generated to have a logic "high" level to reset a mode register (not shown). The pre-reset signal generation circuit 821 may generate a pre-reset signal PRST based on the ECS command AECS and a first bit SRADD<1> of the selection row address SRADD. The pre-reset signal generation circuit 821 may generate the pre-reset signal PRST with a logic "high" level when the ECS operations are performed for memory cells connected to a row path next to a certain row path after the ECS operations are performed for memory cells connected to the certain row path included in the memory bank 250. The OR gate OR823 may perform a logical OR operation of the error reset signal ERST and the pre-reset signal PRST to generate a selection reset signal SRST. The OR gate OR823 may generate the selection reset signal SRST with a logic "high" level when the error reset signal ERST or the pre-reset signal PRST is generate to have a logic "high" level.

The selection reset signal generation circuit 812 may generate the error reset signal ERST with a logic "high" level and the selection reset signal SRST with a logic "high" level when the reset signal RST or the mode register reset signal MRST is generated to have a logic "high" level after the ECS operations are performed for all of memory cells included in the memory bank 250. The selection reset signal generation circuit 812 may generate the selection reset signal SRST with a logic "high" level when the ECS operations are performed for memory cells connected to a row path next to a certain row path after the ECS operations are performed for all of memory cells connected to the certain row path included in the memory bank 250.

The error log control circuit 813 may include an error counter 831, an error comparator 833, and an error code latch 835. The error counter 831 may count the internal error flag IEFLAG to generate an error count signal ECNT. The error counter 831 may count up the error count signal ECNT when the internal error flag IEFLAG with a logic "high" level is generated by an error detected from a codeword stored in memory cells for which the ECS operation is performed. The error counter 831 may initialize the error count signal ECNT when the error rest signal ERST is generated to have a logic "high" level. The error comparator 833 may compare the error count signal ECNT with a maximum error value MAXE to generate an error comparison signal ECOM. The error comparator 833 may generate the error comparison signal ECOM having a first logic level when the error count signal ECNT increases to have a value which is equal to or greater than the maximum error value MAXE. The error comparator 833 may generate the error comparison signal ECOM having a second logic level when the error count signal ECNT has a value which is less than the maximum error value MAXE. The error code latch 835 may latch the error count signal ECNT based on the error comparison signal ECOM to generate a latched error code LEC. The error code latch 835 may latch the error count signal ECNT to output the latched signal of the error count signal ECNT as the latched error code LEC when the error comparison signal ECOM having the first logic level is generated by the error count signal ECNT having a value which is equal to or greater than the maximum error value MAXE. The maximum error value MAXE may be stored in a mode register by a mode register set.

The error log control circuit 813 may latch the error count signal ECNT to output the latched signal of the error count signal ECNT as the latched error code LEC when the number of errors detected during the ECS operations is equal to or greater than the maximum error value MAXE after the ECS operations are performed for all of memory cells included in the memory bank 250.

The row error log control circuit 815 may include a row counter 841, a row comparator 843, a row error code latch 845, a bank address latch 847, and a row address latch 849. The row counter 841 may count the internal error flag IEFLAG to generate a row error count signal RECNT. The row counter 841 may increase the row error count signal RECNT when the internal error flag IEFLAG is generated to have a logic "high" level by an error detected from a codeword stored in memory cells when the ECS operations are performed for all of memory cells included in one row path. The row counter 841 may initialize the row error count signal RECNT if the selection rest signal SRST is generated to have a logic "high" level when the ECS operations are performed for a row path next to a certain row path after the ECS operations are performed for memory cells included in the certain row path. The row comparator 843 may compare the row error count signal RECNT with a row latch error code RLEC to generate a row comparison signal RCOM. The row comparator 843 may generate the row comparison signal RCOM having the first logic level when the row error count signal RECNT increases to have a value which is equal to or greater than the row latch error code RLEC. The row comparator 843 may generate the row comparison signal RCOM having the second logic level when the row error count signal RECNT has a value which is less than the row latch error code RLEC. The row error code latch 845 may latch the row error count signal RECNT based on the row comparison signal RCOM to generate the row latch error code RLEC. The row error code latch 845 may latch the row error count signal RECNT to output the latched signal of the row error count signal RECNT as the row latch error code RLEC when the row comparison signal RCOM having the first logic level is generated by the row error count signal RECNT having a value which is equal to or greater than the row latch error code RLEC. The bank address latch 847 may generate a latched bank address LBADD from the selection bank address SBADD based on the row comparison signal RCOM. The bank address latch 847 may latch the selection bank address SBADD when the row comparison signal RCOM has the first logic level and may output the latched address of the selection bank address SBADD as the latched bank address LBADD. The row address latch 849 may generate a latched row address LRADD from the selection row address SRADD based on the row comparison signal RCOM. The row address latch 849 may latch the selection row address SRADD when the row comparison signal RCOM has the first logic level and may output the latched address of the selection row address SRADD as the latched to row address LRADD.

The row error log control circuit 815 may compare the numbers of the errors of all of the row paths with each other to output the information on the maximum number of the errors as the row latch error code RLEC and to output the information on the row path having the maximum number of the errors as the latched bank address LBADD and the latched row address LRADD.

The error log output circuit 817 may include inverters IV811, IV813, IV815, IV817, IV821, and IV823. The inverter IV811 may inversely buffer a first bit signal ELC<1> of the error log command ELC to output the inversely buffered signal of the first bit signal ELC<1> of the error log command ELC. The inverter IV813 may inversely buffer the latched error code LEC to output the inversely buffered signal of the latched error code LEC as the error log signal ELOG when the first bit signal ELC<1> of the error log command ELC has a logic "high" level. The inverter IV815 may inversely buffer a second bit signal ELC<2> of the error log command ELC to output the inversely buffered signal of the second bit signal ELC<2> of the error log command ELC. The inverter IV817 may inversely buffer the row latch error code RLEC to output the inversely buffered signal of the row latch error code RLEC as the error log signal ELOG when the second bit signal ELC<2> of the error log command ELC has a logic "high" level. The inverter IV821 may inversely buffer the latched bank address LBADD to output the inversely buffered signal of the latched bank address LBADD as the error log bank address ELBADD when the second bit signal ELC<2> of the error log command ELC has a logic "high" level. The inverter IV823 may inversely buffer the latched row address LRADD to output the inversely buffered signal of the latched row address LRADD as the error log row address ELRADD when the second bit signal ELC<2> of the error log command ELC has a logic "high" level.

Figure 14:
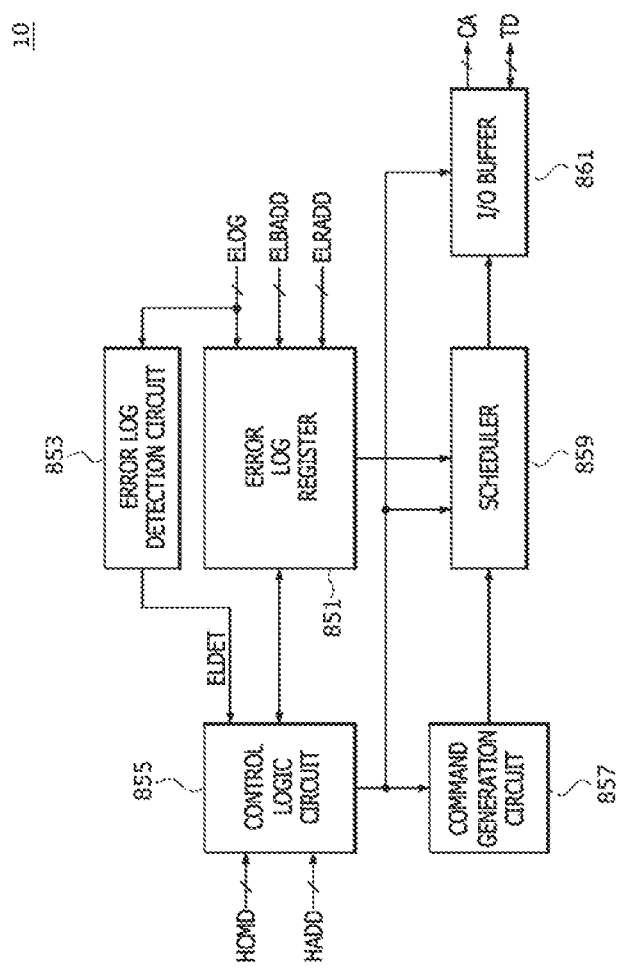
FIG. 14 is a block diagram, illustrating an example of a controller, included in the semiconductor system of FIG. 1.

FIG. 14 is a block diagram illustrating a configuration of the controller 10 included in the semiconductor system 1 of FIG. 1. As illustrated in FIG. 14, the controller 10 may include an error log register 851, an error log detection circuit 853, a control logic circuit 855, a command generation circuit 857, a scheduler 859, and an I/O buffer 861.

The error log register 851 may store the error log signal ELOG, the error log bank address ELBADD, and the error log row address ELRADD which are outputted from the semiconductor device 20.

The error log detection circuit 853 may generate an error log detection signal ELDET based on the error log signal ELOG. The error log detection circuit 853 may generate the error log detection signal ELDET which is activated when the number of memory cells storing an erroneous codeword verified by the error log signal ELOG is equal to or greater than a predetermined error limitation value. The predetermined error limitation value may be set to be different according to the embodiments.

The control logic circuit 855 may control the command generation circuit 857, the scheduler 859, and the I/O buffer 861 based on a host command HCMD and a host address HADD outputted from a host (1100 of FIG. 16) to perform the refresh operation, the active operation, the read operation, the write operation, or the ECS operation of the semiconductor device 20.

When the error log detection signal ELDET is activated, the control logic circuit 855 may control the command generation circuit 857, the scheduler 859, and the I/O buffer 861 such that the internal operations for the memory cells included in a row path selected by the error log bank address ELBADD and the error log row address ELRADD are not performed in the semiconductor device 20.

The I/O buffer 861 may transmit the command/address signal CA and the transmission data TD to the semiconductor device 20 during the write operation. The I/O buffer 861 may receive the transmission data TD from the semiconductor device 20 during the read operation.

Figure 15:
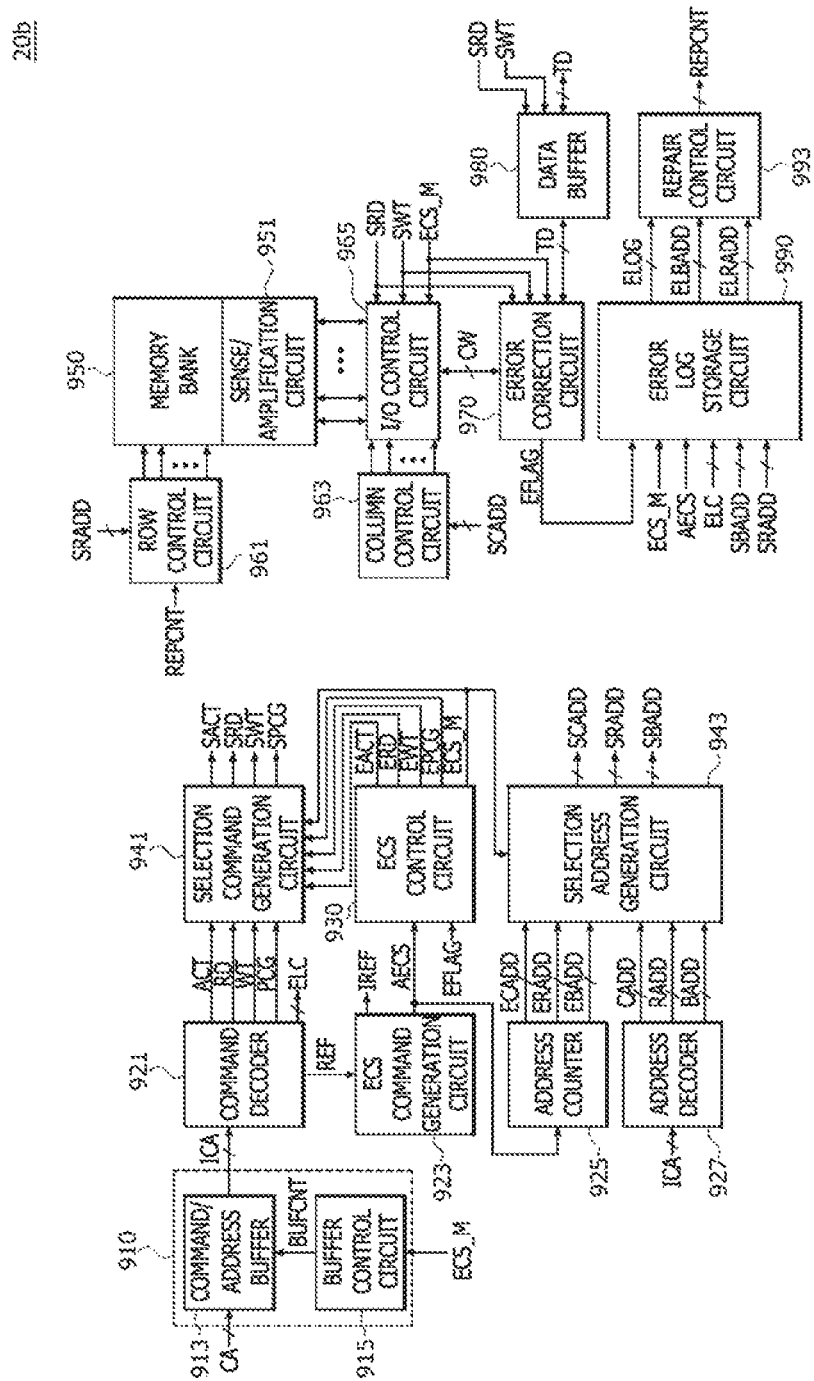
FIG. 15 is a block diagram, illustrating another example of a semiconductor device, included in the semiconductor system of FIG. 1.

FIG. 15 is a block diagram illustrating a configuration of a semiconductor device 20b corresponding to another example of the semiconductor device 20 included in the semiconductor system 1 of FIG. 1. As illustrated in FIG. 15, the semiconductor device 20b may include a command/address receiving circuit 910, a command decoder 921, an ECS command generation circuit 923, an address counter 925, an address decoder 927, the ECS control circuit 930, a selection command generation circuit 941, a selection address generation circuit 943, the memory bank 950, a sense/amplification circuit 951, a row control circuit 961, a column control circuit 963, an I/O control circuit 965, an error correction circuit 970, a data buffer 980, an error log storage circuit 990, and a repair control circuit 993.

The command/address receiving circuit 910 may include a command/address buffer 913 and a buffer control circuit 915. The command/address buffer 913 may buffer a command/address signal CA received through the first transmission line (L11 of FIG. 1) to generate an internal command/ address signal ICA. The buffer control circuit 915 may generate a buffer control signal BUFCNT based on an ECS mode signal ECS_M when an ECS operation is performed. The command/address buffer 913 may receive the buffer control signal BUFCNT generated by the buffer control circuit 915 and may buffer the command/address signal CA to stop an operation for generating the internal command/address signal ICA when the ECS operation is performed.

The command decoder 921 may decode the internal command/address signal ICA to generate a refresh command REF, an active command ACT, a read command RD, a write command WT, a pre-charge command PCG, and an error log command ELC.

The ECS command generation circuit 923 may generate an ECS command AECS and an internal refresh command IREF based on the refresh command REF. The ECS command generation circuit 923 may generate the ECS command AECS when the refresh command REF is generated a certain number of times, corresponding to a predetermined set value. The ECS command generation circuit 923 may generate the internal refresh command IREF based on the refresh command REF when the ECS command AECS is not generated.

The address counter 925 may generate an ECS column address ECADD, an ECS row address ERADD, and an ECS bank address EBADD based on the ECS command AECS. The address counter 925 may count the ECS command AECS to sequentially increase a binary number corresponding to a logic level combination of bits included in the ECS column address ECADD, to sequentially increase a binary number corresponding to a logic level combination of bits included in the ECS row address ERADD, and to sequentially increase a binary number corresponding to a logic level combination of bits included in the ECS bank address EBADD.

The address decoder 927 may decode the internal command/address signal ICA to generate a column address CADD, a row address RADD, and a bank address BADD. The address decoder 927 may decode the internal command/address signal ICA to generate the column address CADD, the row address RADD, and the bank address BADD used for the internal operations including the active operation, the read operation, and the write operation.

The ECS control circuit 930 may generate the ECS mode signal ECS_M based on the ECS command AECS. The ECS mode signal ECS_M may be generated during a period that the ECS operation is performed. The ECS control circuit 930 may generate an ECS active command EACT, an ECS read command ERD, an ECS write command EWT, an ECS pre-charge command EPCG, and an ECS end command (ECS_END of FIG. 5) while the ECS operation is performed. The ECS control circuit 930 may count an internal clock signal (ICLK of FIG. 5) based on the error flag EFLAG to sequentially generate the ECS active command EACT, the ECS read command ERD, the ECS write command EWT, the ECS pre-charge command EPCG, and the ECS end command ECS_END while the ECS operation is performed. When no error detects from a codeword outputted from the memory cells during an ECS error correction operation not to generate the error flag EFLAG, the ECS control circuit 930 does not generate the ECS write command EWT.

The selection command generation circuit 941 may select and output the ECS active command EACT, the ECS read command ERD, the ECS write command EWT, and the ECS pre-charge command EPCG as a selection active command SACT, a selection read command SRD, a selection write command SWT, and a selection pre-charge command SPCG while the ECS operation is performed. The selection command generation circuit 941 may select and output the active command ACT, the read command RD, the write command WT, and the pre-charge command PCG as the selection active command SACT, the selection read command SRD, the selection write command SWT, and the selection pre-charge command SPCG while the ECS operation is not performed.

The selection address generation circuit 943 may select and output the ECS column address ECADD, the ECS row address ECADD, and the ECS bank address ECADD as a selection column address SCADD, a selection row address SRADD, and a selection bank address SBADD while the ECS operation is performed. The selection address generation circuit 943 may select and output the column address CADD, the row address RADD, and the bank address BADD as the selection column address SCADD, the selection row address SRADD, and the selection bank address SBADD while the ECS operation is not performed.

The memory bank 950 may include a plurality of memory cells, and each of the memory cells may be coupled to any one of word lines and any one of bit lines. One of the word lines connected to the memory cells included in the memory bank 950 may be selected by the selection row address SRADD. At least one of the bit lines connected to the memory cells included in the memory bank 950 may be selected by the selection column address SCADD. At least one of the memory cells may be accessed by selecting one of the word lines and at least one of the bit lines.

The sense/amplification circuit 951 may include a plurality of sense amplifiers (not shown). The sense amplifiers included in the sense/amplification circuit 951 may be connected to the memory cells included in the memory bank 950 and may sense and amplify levels of data signals loaded on the bit lines.

The row control circuit 961 may select one of the word lines coupled to the memory cells included in the memory bank 250 as a row path based on the selection row address SRADD. The row control circuit 961 may perform the active operation for loading a codeword stored in the memory cells connected to a word line selected by the selection row address SRADD on the bit lines such that the sense/amplification circuit 951 senses and amplifies data signals of the codeword. The row control circuit 961 may perform a repair operation for a row path having the maximum number of errors based on a repair control signal REPCNT. The row control circuit 961 may perform the repair operation using a way that replaces the row path having the maximum number of errors with a row path connected to redundant memory cells. Because a probability that most of memory cells connected to the row path having the maximum number of errors are failed memory cells is very high, the row control circuit 961 may replace the row path having the maximum number of errors with a row path connected to redundant memory cells using a row repair operation.

The column control circuit 963 may control the I/O control circuit 965 such that the codeword is inputted to or outputted from the sense amplifiers selected by the selection column address SCADD among the plurality of sense amplifiers coupled to the memory cells in a row path selected by the selection row address SRADD. The column control circuit 963 may control the I/O control circuit 965 such that the read operation and the write operation are performed for the memory cells coupled to the sense amplifiers selected by the selection column address SCADD among the plurality of memory cells included in a memory bank performing the active operation. In some other embodiments, the column control circuit 963 may be realized to perform a column repair operation which is executed using a way that replaces a column path connected to a failed memory cell with a redundant column path connected to a redundant memory cell based on the repair control signal REPCNT.

The I/O control circuit 965 may be coupled between the sense/amplification circuit 951 and the error correction circuit 970 to control input or output of a codeword based on the selection read command SRD, the selection write command SWT, and the ECS mode signal ECS_M. The I/O control circuit 965 may output a codeword CW including data and a parity outputted from the memory bank 950 to the error correction circuit 970 during the read operation or the ECS read operation. The I/O control circuit 965 may output the codeword CW received from the error correction circuit 970 to the memory bank 950 during the write operation or the ECS write operation.

The error correction circuit 970 may receive the codeword CW from the I/O control circuit 965 or may output the codeword CW to the I/O control circuit 965 based on the selection read command SRD, the selection write command SWT, and the ECS mode signal ECS_M. The error correction circuit 970 may receive the transmission data TD from the data buffer 980 or may output the transmission data TD to the data buffer 980 based on the selection read command SRD, the selection write command SWT, and the ECS mode signal ECS_M. The error correction circuit 970 may generate the error flag EFLAG based on the codeword CW. When the read operation is performed, the error correction circuit 970 may receive the codeword CW from the I/O control circuit 965 and may decode the codeword CW to generate the error flag EFLAG and to output data included in the codeword CW corrected by the error correction circuit 970 as the transmission data TD through the data buffer 980 if an error is detected from the codeword CW. When the write operation is performed, the error correction circuit 970 may encode the transmission data TD received from the data buffer 980 to generate the codeword CW including data and a parity and may transmit the codeword CW to the I/O control circuit 965 to store the codeword CW in the memory bank 950. When the ECS read operation is performed, the error correction circuit 970 may receive the codeword CW from the I/O control circuit 965 and may decode the codeword CW to generate the error flag EFLAG and the codeword CW corrected by the error correction circuit 970 if an error is detected from the codeword CW. The error correction circuit 970 may generate the corrected codeword CW during the ECS read operation, and the error correction circuit 970 may transmit the corrected codeword CW to the I/O control circuit 965 to store the corrected codeword CW in the memory bank 950 during the ECS write operation.

The data buffer 980 may receive the transmission data TD from the error correction circuit 970 or may output the transmission data TD to the error correction circuit 970 based on the selection read command SRD and the selection write command SWT. The data buffer 980 may receive the transmission data TD from the controller (10 of FIG. 1) or may output the transmission data TD to the controller (10 of FIG. 1) based on the selection read command SRD and the selection write command SWT. When the write operation is performed, the data buffer 980 may transmit the transmission data TD received through the second transmission line (L13 of FIG. 1) to the error correction circuit 970. When the read operation is performed, the data buffer 980 may transmit the transmission data TD received from the error correction circuit 970 to the controller 10 through the second transmission line L13.

The error log storage circuit 990 may generate an error log signal ELOG, an error log row address ELRADD, and an error log bank address ELBADD based on the error flag EFLAG, the ECS mode signal ECS_M, the ECS command AECS, the error log command ELC, the selection row address SRADD, and the selection bank address SBADD. The error log storage circuit 990 may output information on the number of errors detected based on the error flag EFLAG as the error log signal ELOG when the ECS operations are performed for all of the memory cells included in the memory bank 950. When the ECS operations are performed for all of the memory cells included in the memory bank 950, the error log storage circuit 990 may compare the numbers of the errors of all of the row paths with each other based on the error flag EFLAG, the selection row address SRADD, and the selection bank address SBADD to output information on the maximum number of the errors as the error log signal ELOG and to output information on the row path having the maximum number of the errors as the error log row address ELRADD and the error log bank address ELBADD. The error log storage circuit 990 may transmit the error log signal ELOG to the controller 10 through the second transmission line L13. The error log storage circuit 990 may transmit the error log row address ELRADD and the error log bank address ELBADD to the controller 10 through the third transmission line L15.

The repair control circuit 993 may receive the error log signal ELOG, the error log row address ELRADD, and the error log bank address ELBADD to generate the repair control signal REPCNT for executing the repair operation for a row path having the maximum number of errors. The repair control signal REPCNT may include information (e.g., the error log row address ELRADD and the error log bank address ELBADD) on a row path necessitating the repair operation.

According to the embodiments, an ECS operation may be performed based on a refresh command. Thus, the ECS operation for correcting an error of a codeword stored in memory cells to restore the corrected codeword in the memory cells may be performed without using any other command provided by an external device.

In addition, according to the embodiments, reception of a command and an address is interrupted during the ECS operation. Thus, it may be possible to reduce power consumption of a command/address receiving circuit during the ECS operation and to prevent malfunction due to a command/address signal from occurring during the ECS operation.

Moreover, according to the embodiments, commands for the ECS operation may be generated using an internal clock signal or an external clock signal. Thus, the ECS operation may be performed at a constant speed regardless of variation of a data rate.

Furthermore, according to the embodiments, a repair operation may be performed based on information on the maximum number of errors detected from a row path and information on a row path having the maximum number of errors. Thus, the repair operation for a row path having a lot of failed memory cells may be more readily performed.

Figure 16:
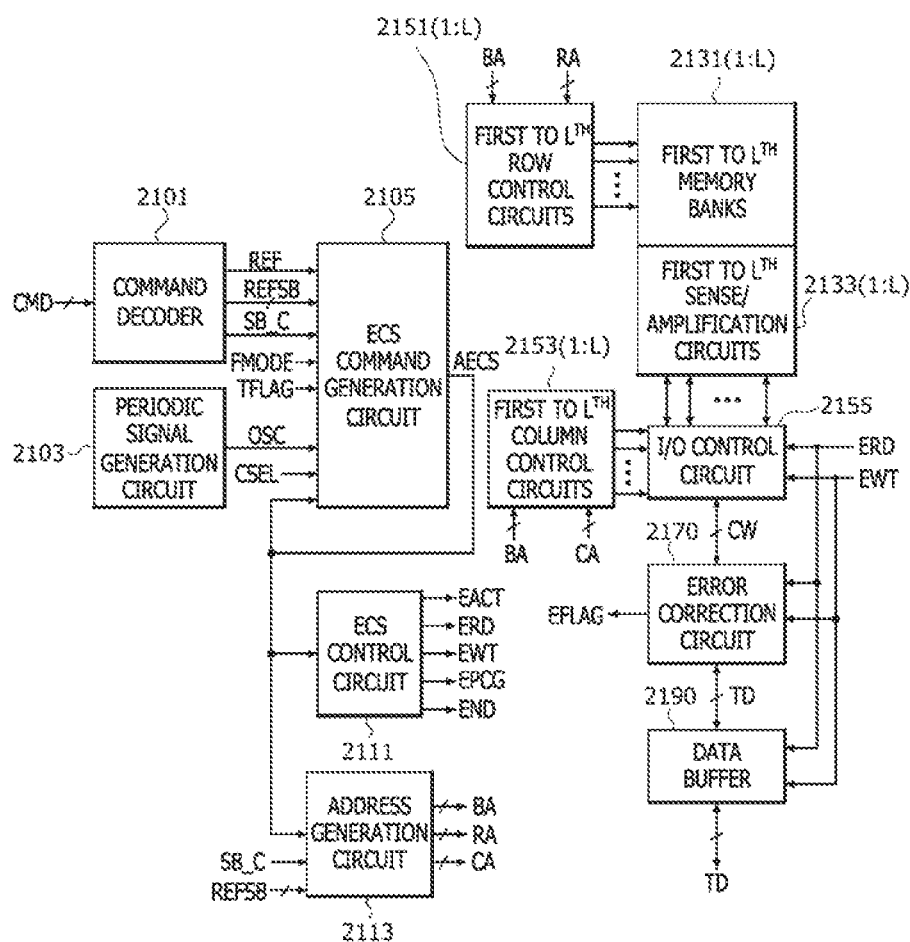
FIG. 16 is a block diagram, illustrating yet another example of a semiconductor device, included in the semiconductor system illustrated in FIG. 1.

FIG. 16 is a block diagram, illustrating a semiconductor device 2010, corresponding to yet another example of the semiconductor device 20, illustrated in FIG. 1. The semiconductor device 2010 may include a command decoder 2101, a periodic signal generation circuit 2103, an ECS command generation circuit 2105, an ECS control circuit 2111, an address generation circuit 2113, first to $L^{th}$ memory banks 2131(1:L), first to $L^{th}$ sense/amplification circuits 2133(1:L), first to $L^{th}$ row control circuits 2151(1:L), first to $L^{th}$ column control circuits 2153(1:L), an I/O control circuit 2155, an error correction circuit 2170, and a data buffer 2190.

The command decoder 2101 may decode a command CMD to generate a refresh command REF, a bank refresh command REFSB, and a single bank flag SB_C. The refresh command REF may be generated to perform a refresh operation for first to $L^{th}$ memory banks 2131(1:L). The bank refresh command REFSB may be generated to perform the refresh operation for each of the first to $L^{th}$ memory banks 2131(1:L). The number of the first to $L^{th}$ memory banks 2131(1:L) may be set to be a natural number. The refresh operation for the first bank 2131(1) may be performed when a first bit signal REFSB<1> of the bank refresh command REFSB is generated, and the refresh operation for the second bank 2131(2) may be performed when a second bit signal REFSB<2> of the bank refresh command REFSB is generated. The single bank flag SB_C may be set to have a first logic level when the refresh operation for the first to $L^{th}$ memory banks 2131(1:L) is performed and may be set to have a second logic level when the refresh operation for each of the first to $L^{th}$ memory banks 2131(1:L) is performed. In the present embodiment, the first logic level may be set as a logic "low" level, and the second logic level may be set as a logic "high" level.

The periodic signal generation circuit 2103 may generate a periodic signal OSC. The periodic signal generation circuit 2103 may generate the periodic signal OSC with a uniform cycle regardless of the temperature or the operation mode (for example, a fine granularity refresh (FGR) mode). The FGR mode may be an operation mode to reduce the number of rows for which the refresh operation is performed in order to reduce the refresh cycle time 'tRFC' and to set a generation speed of the refresh command REF or the bank refresh command REFSB to betimes faster as compared to the generation speed of the refresh command REF or the bank refresh command REFSB in a non-FGR mode (wherein, the number 'M' denotes a natural number).

The ECS command generation circuit 2105 may generate an ECS command AECS based on the refresh command REF, the bank refresh command REFSB, the single bank flag SB_C, a mode signal FMODE, a temperature flag TFLAG, the periodic signal OSC, a command selection signal CSEL, and the ECS command AECS. The mode signal FMODE may be generated to have a predetermined logic level to activate the FGR mode. For example, the semiconductor device may operate in a non-FGR mode when the mode signal FMODE has the first logic level, and the semiconductor device may operate in the FGR mode when the mode signal FMODE has the second logic level. The mode signal FMODE may be stored in a mode register by a mode register set or may be provided by the controller (10 of FIG. 1 or 1300 of FIG. 31). The temperature flag TFLAG may be generated to have a predetermined logic level when a temperature is over a predetermined temperature. For example, the temperature flag TFLAG may be generated to have the first logic level when the temperature is below 85 degrees Celsius ("low temperature"), and the temperature flag TFLAG may be generated to have the second logic level when the temperature is over 85 degrees Celsius ("high temperature"). The temperature flag TFLAG may be generated by a temperature sensor (not shown) that is included in the semiconductor device 2010 or may be provided by the controller (10 of FIG. 1 or 1300 of FIG. 31). The generation speed of bit signals that are included in the refresh command REF or the bank refresh command REFSB at a high temperature may be set to be '2N' times the generation speed of bit signals included in the refresh command REF or the bank refresh command REFSB at a low temperature (wherein, the number 'N' denotes a natural number).

When the refresh command REF is generated in a non-FGR mode, the ECS command generation circuit 2105 may perform a counting operation to generate the ECS command AECS. If the refresh command REF is generated in the FGR mode, the ECS command generation circuit 2105 may perform a counting operation to generate the ECS command AECS when the refresh command REF is generated '2M' times. If the bank refresh command REFSB is generated in the FGR mode, the ECS command generation circuit 2105 may perform a counting operation to generate the ECS command AECS when all of the bit signals that are included in the bank refresh command REFSB are generated '2M' times.

When the refresh command REF is generated at a high temperature in a non-FGR mode, the ECS command generation circuit 2105 may perform a counting operation to generate the ECS command AECS when the refresh command REF is generated '2N' times. When the bank refresh command REFSB is generated at a high temperature in a non-FGR mode, the ECS command generation circuit 2105 may perform a counting operation to generate the ECS command AECS when all of bit signals included in the bank refresh command REFSB are generated '2N' times.

When the refresh command REF is generated at a high temperature in the FGR mode, the ECS command generation circuit 2105 may perform a counting operation to generate the ECS command AECS when the refresh command REF is generated '2N×2M' times. When the bank refresh command REFSB is generated at a high temperature in the FGR mode, the ECS command generation circuit 2105 may perform a counting operation to generate the ECS command AECS when all of bit signals in the bank refresh command REFSB are generated '2N×2M' times.

When the ECS command AECS is generated while the refresh operation for each of the first to $L^{th}$ memory banks 2131(1:L) is performed, the ECS command generation circuit 2105 may stop the counting operation, which is performed by the bank refresh command REFSB, to maintain a status in which the ECS command AECS is generated.

The ECS control circuit 2111 may sequentially generate an ECS active command EACT, an ECS read command ERD, an ECS write command EWT, an ECS pre-charge command EPCG, and an end signal END when the ECS command AECS is generated. The ECS active command EACT may be generated to perform an ECS active operation. The ECS read command ERD may be generated to perform an ECS read operation. The ECS write command EWT may be generated to perform an ECS write operation. The ECS pre-charge command EKG may be generated to perform a pre-charge operation of memory cells for which the ECS operation is performed. The end signal END may be generated to terminate the ECS operation. The ECS control circuit 2111 may generate the ECS read command ERD for each of codewords CW stored in the memory cells for which the ECS operation is performed after generation of the ECS active command EACT and may generate the end signal END, to determine whether errors exist in the codewords CW that are stored in the memory cells for which the ECS operation is performed.

The address generation circuit 2113 may generate a bank address BA, a row address RA, and a column address CA based on the ECS command AECS, the single bank flag and the bank refresh command REFSB. The address generation circuit 2113 may generate the bank address BA, the row address RA, and the column address CA to perform the ECS operation for the first to $L^{th}$ memory banks 2131(1:L) when the ECS command AECS is generated while the refresh operation for the first to $L^{th}$ memory banks 2131(1:L) is performed. The address generation circuit 2113 may generate the bank address BA, the row address RA, and the column address CA to perform the ECS operation for each of the first to $L^{th}$ memory banks 2131(1:L) when the ECS command AECS is generated while the refresh operation for the first to $L^{th}$ memory banks 2131(1:L) is performed.

Each of the first to $L^{th}$ memory banks 2131(1:L) may include memory cells, and each of the memory cells may be coupled to one of word lines and one of bit lines. One of the word lines, coupled to the memory cells, included in each of the first to $L^{th}$ memory banks 2131(1:L), may be selected by the bank address BA and the row address RA. At least one of the bit lines, coupled to the memory cells, included in each of the first to $L^{th}$ memory banks 2131(1:L), may be selected by the bank address BA and the column address CA. At least one of the memory cells, included in each of the first to $L^{th}$ memory banks 2131(1:L), may be accessed by selecting one of the word lines and at least one of the bit lines. The number of the word lines, coupled to the memory cells, included in each of the first to $L^{th}$ memory banks 2131(1:L), may be set to be different according to the embodiments. The number of the bit lines, coupled to the memory cells, included in each of the first to $L^{th}$ memory banks 2131(1:L), may also be set to be different according to the embodiments. The codeword CW that includes data and a parity may be stored in some of the memory cells included in each of the first to $L^{th}$ memory banks 2131(1:L).

Each of the first to $L^{th}$ sense/amplification circuits 2133(1:L) may include a plurality of sense amplifiers (not shown). The sense amplifiers in each of the first to $L^{th}$ sense/amplification circuits 2133(1:L) may be connected to the bit lines that are coupled to the memory cells in any one of the first to $L^{th}$ memory banks 2131(1:L) and may sense and amplify the levels of the data signals that are loaded on the bit lines.

The first to $L^{th}$ row control circuits 2151(1:L) may select one word line that is selected by the row address RA among the word lines that are coupled to the memory cells, included in one bank, selected by the bank address BA among the first to $L^{th}$ memory banks 2131(1:L) as a row path. The first to $L^{th}$ row control circuits 2151(1:L) may perform the ECS active operation for loading data and parities, stored in the memory cells, in a row path that is selected by the bank address BA and the row address RA on the bit lines such that one that is selected from the first to $L^{th}$ sense/amplification circuits 2133(1:L) senses and amplifies the levels of the data and the parities.

The first to $L^{th}$ column control circuits 2153(1:L) may control the I/O control circuit 2155 such that the data are inputted to or outputted from at least one sense amplifier that is selected by the bank address BA and the column address CA among the sense amplifiers, included in any one of the first to $L^{th}$ sense/amplification circuits 2133(1:L), coupled to the memory cells in the row path. The first to $L^{th}$ column control circuits 2153(1:L) may control the I/O control circuit 2155 such that the ECS read operation and the ECS write operation are performed for the memory cells that are coupled to the sense amplifiers that are selected by the bank address BA and the column address CA among the memory cells that are included in one memory bank that performs the active operation among the first to $L^{th}$ memory banks 2131(1:L).

The I/O control circuit 2155 may be coupled between the error correction circuit 2170 and the first to $L^{th}$ sense/amplification circuits 2133(1:L) to control the input or output of data based on the ECS read command ERD and the ECS write command EWT. The I/O control circuit 2155 may output the codeword CW that is outputted from the first to $L^{th}$ memory banks 2131(1:L) to the error correction circuit 2170 during the ECS read operation. The I/O control circuit 2155 may output the codeword CW that is received from the error correction circuit 2170 to the first to $L^{th}$ memory banks 2131(1:L) during the ECS write operation. The codeword CW that is outputted from the error correction circuit 2170 may include corrected data and a parity.

The error correction circuit 2170 may receive the codeword CW from the I/O control circuit 2155 or may output the codeword CW to the I/O control circuit 2155 based on the ECS read command ERD and the ECS write command EWT. The error correction circuit 2170 may receive the transmission data TD from the data buffer 2190 or may output the transmission data TD to the data buffer 2190 based on the ECS read command ERD and the ECS write command EWT. The error correction circuit 2170 may generate an error flag EFLAG based on the codeword CW. While the ECS read operation is performed, the error correction circuit 2170 may receive the codeword CW from the I/O control circuit 2155 and may decode the codeword CW to generate the error flag EFLAG when an error exists in the codeword CW. The error correction circuit 2170 may perform an error correction operation to generate a corrected codeword. The error correction circuit 2170 may generate the corrected codeword through the ECS read operation and the error correction operation and may transmit the corrected codeword to the I/O control circuit 2155 to store the corrected codeword in the first to $L^{th}$ memory banks 2131(1:L) during the ECS write operation. The error correction circuit 2170 may be realized to correct an error included in the codeword CW using an error correction code (ECC).

The data buffer 2190 may receive the transmission data TD from the error correction circuit 2170 or may output the transmission data TD to the error correction circuit 2170 based on the ECS read command ERD and the ECS write command EWT. The data buffer 2190 may receive the transmission data TD from the controller (10 of FIG. 1 or 1300 of FIG. 31) or may output the transmission data TD to the controller (10 of FIG. 1 of FIG. 31) based on the ECS read command ERD and the ECS write command EWT.

Figure 17:
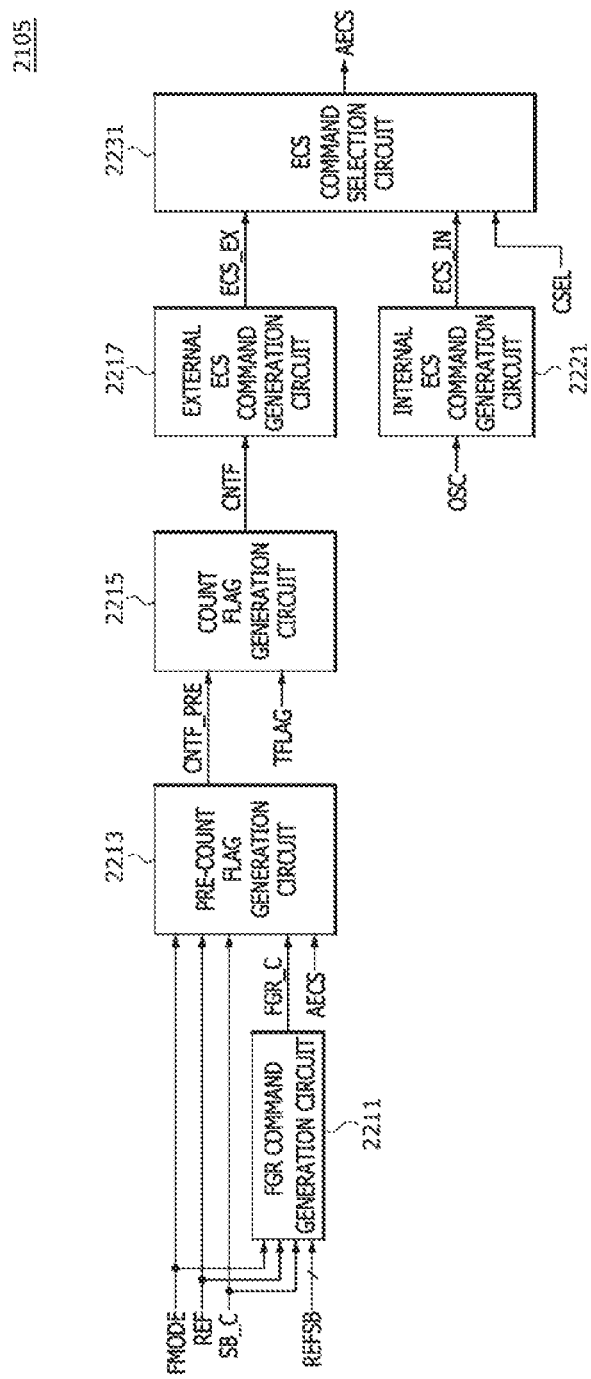
FIG. 17 is a block diagram, illustrating an ECS command generation circuit included in the semiconductor device, illustrated in FIG. 16.

FIG. 17 is a block diagram, illustrating an example of the ECS command generation circuit 2105. As illustrated in FIG. 17, the ECS command generation circuit 2105 may include an FGR command generation circuit 2211, a pre-count flag generation circuit 2213, a count flag generation circuit 2215, an external ECS command generation circuit 2217, an internal ECS command generation circuit 2221, and an ECS command selection circuit 2231.

The FGR command generation circuit 2211 may generate an FGR command FGR_C to activate the FGR mode based on the mode signal FMODE, the refresh command REF, the single bank flag SB_C, and the bank refresh command REFSB. The FGR command generation circuit 2211 might not generate the FGR command FGR_C when the mode signal FMODE has the first logic level to inactivate the FGR mode. The FGR command generation circuit 2211 may generate the FGR command FGR_C when the refresh command REF is generated to perform the refresh operation for the first to $L^{th}$ memory banks 2131(1:L) while the mode signal FMODE has the second logic level to activate the FGR mode. The FGR command generation circuit 2211 may generate the FGR command FGR_C when all of the bit signals that are included in the bank refresh command REFSB are generated to perform the refresh operation for each of the first to $L^{th}$ memory banks 2131(1:L) while the mode signal FMODE has the second logic level to activate the FGR mode.

The pre-count flag generation circuit 2213 may generate a pre-count flag CNTF_PRE based on the mode signal FMODE, the refresh command REF, the single bank flag SB_C, the FGR command FGR_C, and the ECS command AECS. The pre-count flag generation circuit 2213 may generate the pre-count flag CNTF_PRE when the refresh command REF is generated while the mode signal FMODE has the first logic level to inactivate the FGR mode. The pre-count flag generation circuit 2213 may generate the pre-count flag CNTF_PRE when the FGR command FGR_C is generated '2M' times while the mode signal FMODE has the second logic level to activate the FGR mode. In the present embodiment, the number 'M' may be set to be '1'. The pre-count flag generation circuit 2213 may terminate generation of the pre-count flag CNTF_PRE when the ECS command AECS is generated while the refresh operation for each of the first to $L^{th}$ memory banks 2131(1:L) is performed so that the single bank flag SB_C has the second logic level.

The count flag generation circuit 2215 may generate a count flag CNTF based on the pre-count flag CNTF_PRE and the temperature flag TFLAG. The count flag generation circuit 2215 may generate the count flag CNTF when the temperature flag TFLAG is set to have the first logic level at a low temperature and the pre-count flag CNTF_PRE is generated. The count flag generation circuit 2215 may generate the count flag CNTF when the temperature flag TFLAG is set to have the second logic level at a high temperature and the pre-count flag CNTF_PRE is generated '2N' times. In the present embodiment, the number 'N' may be set to be '1'.

The external ECS command generation circuit 2217 may count the count flag CNTF and may generate an external ECS command ECS_EX when the eount flag CNTF is generated a certain number of times, corresponding to a predetermined set value. For example, the external ECS command generation circuit 2217 may generate the external ECS command ECS_EX when the count flag CNTF is generated by fourteen times.

The internal ECS command generation circuit 2221 may count the periodic signal OSC and may generate an internal ECS command ECS_IN when a pulse of the periodic signal OSC occurs a certain number of times, corresponding to a predetermined set value. For example, the internal ECS command generation circuit 2221 may generate the internal ECS command ECS_IN when a pulse of the periodic signal OSC occurs fourteen times.

The ECS command selection circuit 2231 may generate the ECS command AECS from the external ECS command ECS_EX and the internal ECS command ECS_IN based on the command selection signal CSEL. The ECS command selection circuit 2231 may select and output the external ECS command ECS_EX as the ECS command AECS when the command selection signal CSEL has the first logic level and may select and output the internal ECS command ECS_IN as the ECS command AECS when the command selection signal CSEL has the second logic level. The command selection signal CSEL may be stored in a mode register by a mode register set or may be provided by the controller (10 of FIG. 1 or 1300 of FIG. 31).

Figure 18:
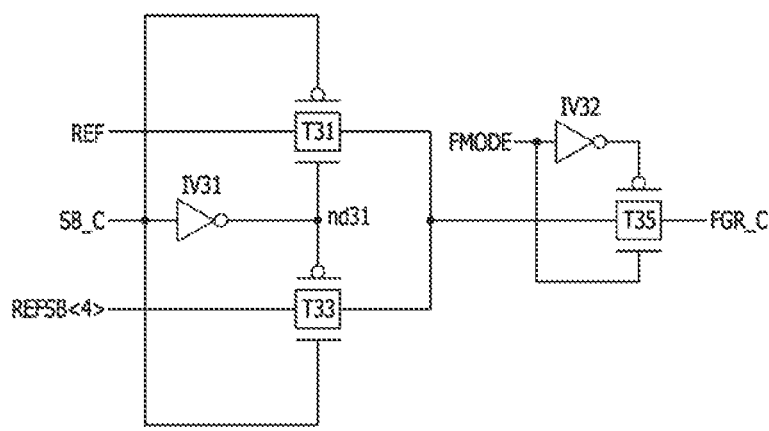
FIG. 18 is a circuit diagram, illustrating an FGR command generation circuit, included in the ECS command generation circuit illustrated in FIG. 17.

FIG. 18 is a circuit diagram, illustrating an example of the FGR command generation circuit 2211.

As illustrated in FIG. 18, the FGR command generation circuit 2211 may include inverters IV31 and IV32 and transfer gates T31, T33, and T35. The inverter IV31 may inversely buffer the single bank flag SB_C to output the inversely buffered signal of the single bank flag SB_C. The transfer gate T31 may be turned on when the refresh operation for the first to $L^{th}$ memory banks 2131(1:L) is performed so that the single bank flag SB_C has a logic "low" level. The transfer gate T33 may be turned on when the refresh operation for each of the first to $L^{th}$ memory banks 2131(1:L) is performed so that the single bank flag SB_C has a logic "high" level. The inverter IV32 may inversely buffer the mode signal FMODE to output the inversely buffered signal of the mode signal FMODE. The transfer gate T35 may be turned on when the mode signal FMODE is set to have a logic "high" level to activate the FGR mode. The FGR command generation circuit 2211 may turn off the transfer gate T35 not to generate the FGR command FGR_C when the mode signal FMODE is set to have a logic "low" level to inactivate the FGR mode. The FGR command generation circuit 2211 may output the refresh command REF as the FGR command FGR_C through the transfer gates T31 and T35, which are turned on, when the refresh command REF is generated while the mode signal FMODE has a logic "high" level in the FGR mode. The FGR command generation circuit 2211 may output the bank refresh command REFSB as the FGR command FGR_C through the transfer gates T33 and T35, which are turned on, when the bank refresh command REFSB is generated while the mode signal FMODE has a logic "high" level in the FGR mode.

Figure 19:
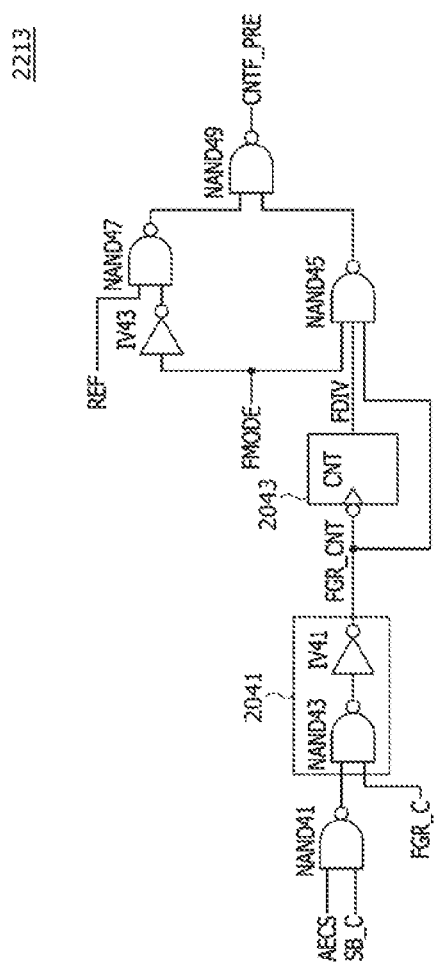
FIG. 19 is a circuit diagram, illustrating a pre-count flag generation circuit, included in the ECS command generation circuit illustrated in FIG. 17.

FIG. 19 is a circuit diagram, illustrating an example of the pre-count flag generation circuit 2213.

As illustrated in FIG. 19, the pre-count flag generation circuit 2213 may include NAND gates NAND41, NAND43, NAND45, NAND47, and NAND49 and inverters IV41 and IV43, and a counter 2043. The NAND gate NAND41 may receive the ECS command AECS and the single bank flag SB_C to perform a logical NAND operation based on the ECS command AECS and the single bank flag SB_C. The NAND gate NAND43 and the inverter IV41 may be coupled in series, forming the FGR count signal generation circuit 2041, and the FGR count signal generation circuit 2041 may perform a logical AND operation based on the FGR command FGR_C and an output signal of the NAND gate NAND41 to generate an FGR count signal FGR_CNT. The counter 2043 may perform a counting operation to generate an FGR division signal FDIV at every point in time when a logic level of the FGR count signal FGR_CNT changes from a logic "high" level to a logic "low" level (hereinafter, referred to as a 'falling edge'). The NAND gate NAND45 may perform a logical NAND operation based on the mode signal FMODE, the FGR division signal FDIV, and the FGR count signal FGR_CNT. The inverter IV43 may inversely buffer the mode signal FMODE to output the inversely buffered signal of the mode signal FMODE. The NAND gate NAND47 may receive the refresh command REF and an output signal of the inverter IV43 to perform a logical NAND operation of the refresh command REF and an output signal of the inverter IV43. The NAND gate NAND49 may perform a logical NAND operation based on the output signals of the NAND gates NAND45 and NAND47 to generate the pre-count flag CNTF_PRE.

The pre-count flag generation circuit 2213 may buffer the refresh command REF through the NAND gates NAND47 and NAND49 to output the buffered refresh command as the pre-count flag CNTF_PRE when the refresh command REF is generated to have a logic "high" level while the mode signal FMODE has a logic "low" level to inactivate the FGR mode. The pre-count flag generation circuit 2213 may generate the FGR division signal FDIV through the counter 2043 and may generate and output the pre-count flag CNTF_PRE through the NAND gates NAND45 and NAND49, when the FGR command FGR_C is generated twice while the mode signal FMODE has a logic "high" level to activate the FGR mode. The pre-count flag generation circuit 2213 may generate the FGR count signal FGR_CNT with a logic "low" level to set the pre-count flag CNTF_PRE to a logic "low" level, when the ECS command AECS is generated to have a logic "high" level while the refresh operation for each of the first to $L^{th}$ memory banks 2131(1:L) is performed so that the single bank flag SB_C has a logic "high" level.

Figure 20:
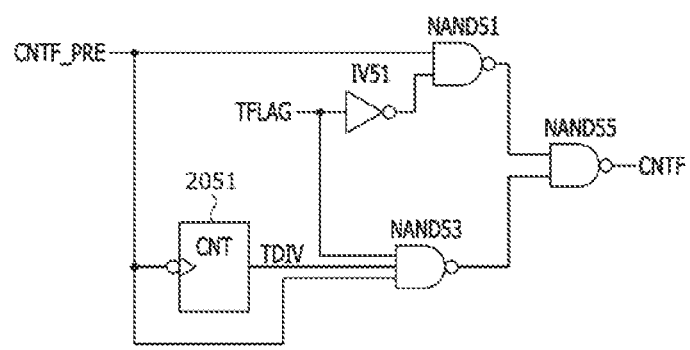
FIG. 20 is a circuit diagram, illustrating a count flag generation circuit, included in the ECS command generation circuit illustrated in FIG. 17.

FIG. 20 is a circuit diagram, illustrating an example of the count flag generation circuit 2215.

As illustrated in FIG. 20, the count flag generation circuit 2215 may include a counter 51, an inverter IV51, and NAND gates NAND51, NAND53, and NAND55. The counter 51 may perform a counting operation at every falling edge of the pre-count flag CNTF_PRE to generate a temperature division signal TDIV. The inverter IV51 may inversely buffer the temperature flag TFLAG to output the inversely buffered signal of the temperature flag TFLAG. The NAND gate NAND51 may perform a logical NAND operation based on the pre-count flag CNTF_PRE and an output signal of the inverter IV51. The NAND gate NAND53 may perform a logical NAND operation based on the temperature flag TFLAG, the temperature division signal TDIV, and the pre-count flag CNTF_PRE. The NAND gate NAND55 may perform a logical NAND operation based on the output signals of the NAND gates NAND51 and NAND53 to generate the count flag CNTF.

The count flag generation circuit 2215 may buffer the pre-count flag CNTF_PRE through the NAND gates NAND51 and NAND55 to output the buffered pre-count flag as the count flag CNTF when the temperature flag TFLAG is set to have a logic "low" level at a low temperature and the pre-count flag CNTF_PRE is generated to have a logic "high" level. The count flag generation circuit 2215 may generate the temperature division signal TDIV with a logic "high" level and may buffer the temperature division signal TDIV through the NAND gates NAND53 and NAND55 to generate the count flag CNTF, when the temperature flag TFLAG is set to have a logic "high" level at a high temperature and the pre-count flag CNTF_PRE with a logic "high" level is generated twice.

FIGS. 21 to 26 are timing diagrams, illustrating operations of the pre-count flag generation circuit 2213 and the count flag generation circuit 2215.

Figure 21:
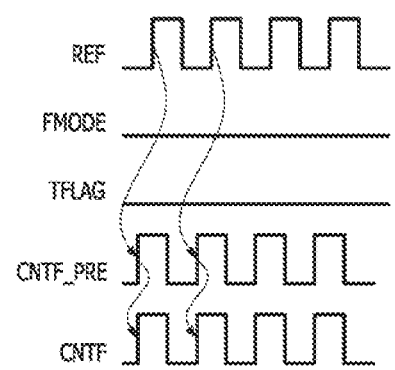
FIGS. 21 to 26 are timing diagrams, illustrating operations of the pre-count flag generation circuit, illustrated in FIG. 19, and the count flag generation circuit, illustrated in FIG. 20.

As illustrated in FIG. 21, the pre-count flag CNTF_PRE may be generated when the refresh command REF is generated while the mode signal FMODE has a logic "low" level to inactivate the FGR mode. The count flag CNTF may be generated when the pre-count flag CNTF_PRE is generated while the temperature flag TFLAG has a logic "low" level at a low temperature.

Figure 22:
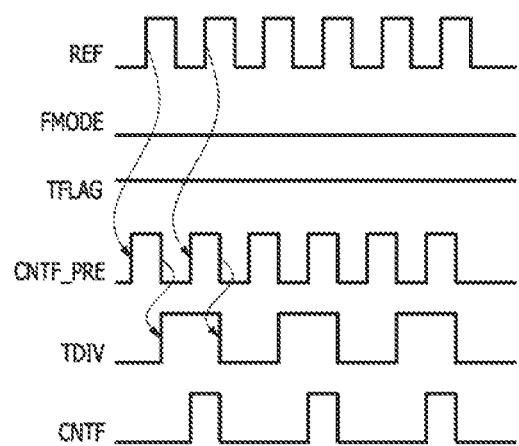

As illustrated in FIG. 22, the pre-count flag CNTF_PRE may be generated when the refresh command REF is generated while the mode signal FMODE has a logic "low" level to inactivate the FGR mode. The count flag CNTF may be generated by the temperature division signal TDIV and the pre-count flag CNTF_PRE when the pre-count flag CNTF_PRE is generated twice while the temperature flag TFLAG has a logic "high" level at a high temperature. In the present embodiment, the refresh command REF at a high temperature may be set to have a frequency which is twice the frequency of the refresh command REF at a low temperature. Because the count flag CNTF is generated once when the refresh command REF is generated twice, the count flag CNTF may be uniformly generated even though the refresh command REF is generated to be twice as fast at a high temperature as compared to the refresh command REF at a low temperature.

Figure 23:
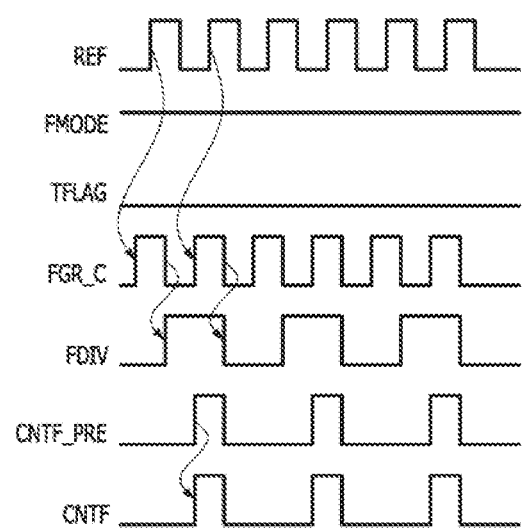

As illustrated in FIG. 23, while the mode signal FMODE has a logic "high" level to activate the FGR mode, the FGR command FGR_C may be generated when the refresh command REF is generated, the FGR division signal FDIV may be generated when the FGR command FGR_C is generated twice, and the pre-count flag CNTF_PRE may be generated when both of the FGR command FGR_C and the FGR division signal FDIV have a logic "high" level. The count flag CNTF may be generated when the pre-count flag CNTF_PRE is generated while the temperature flag TFLAG has a logic "low" level at a low temperature. In the present embodiment, the refresh command REF in the FGR mode may be generated to be twice as fast as the refresh command REF in the non-FGR mode. Because the count flag CNTF is generated once when the refresh command REF is generated twice, the count flag CNTF may be uniformly generated even though the refresh command REF is generated to be twice as fast in the FGR mode as compared to the refresh command REF in the non-FGR mode.

Figure 24:
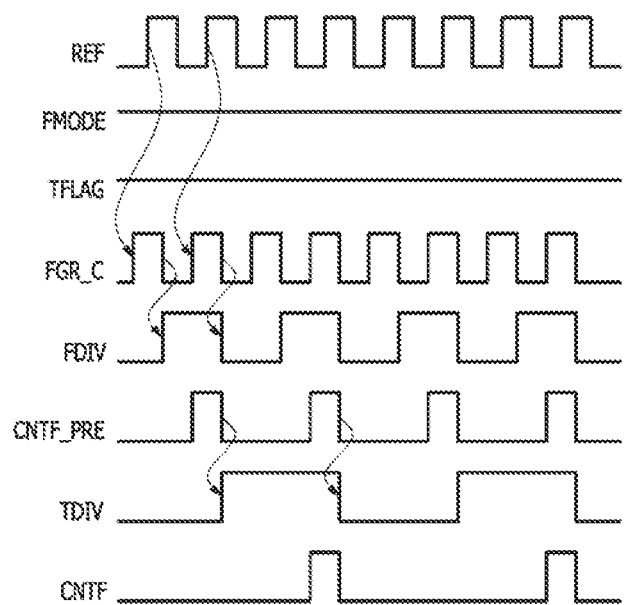

As illustrated in FIG. 24, while the mode signal FMODE has a logic "high" level to activate the FGR mode, the FGR command FGR_C may be generated when the refresh command REF is generated, the FGR division signal FDIV may be generated when the FGR command FGR_C is generated twice, and the pre-count flag CNTF_PRE may be generated when both of the FGR command FGR_C and the FGR division signal FDIV have a logic "high" level. The count flag CNTF may be generated by the temperature division signal TDIV and the pre-count flag CNTF_PRE when the pre-count flag CNTF_PRE is generated twice while the temperature flag TFLAG has a logic "high" level at a high temperature. In the present embodiment, the refresh command REF at a high temperature in the FGR mode may be set to have a frequency which is four times the frequency of the refresh command REF at a low temperature in the non-FGR mode. Because the count flag CNTF is generated once when the refresh command REF is generated four times, the count flag CNTF may be uniformly generated even though the refresh command REF is generated to be four times faster at a high temperature in the FGR mode as compared to the refresh command REF at a low temperature in the non-FGR mode.

Figure 25:
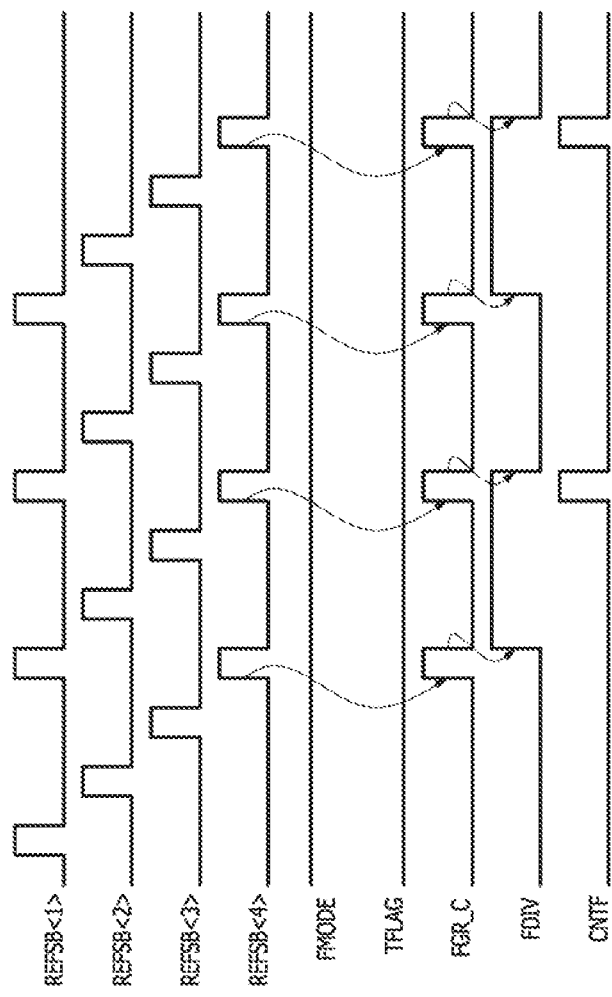

As illustrated in FIG. 25, the FGR command FGR_C may be generated when first to fourth bit signals REFSB<1:4> of the bank refresh command REFSB are sequentially generated to perform the refresh operation for each of the first to $L^{th}$ memory banks 2131(1:L) while the mode signal FMODE has a logic "high" level to activate the FGR mode. The FGR division signal FDIV may be generated when the FGR command FGR_C is generated twice, and the pre-count flag CNTF_PRE may be generated when both of the FGR command FGR_C and the FGR division signal FDIV have a logic "high" level. The count flag CNTF may be generated when the pre-count flag CNTF_PRE is generated while the temperature flag TFLAG has a logic "low" level at a low temperature. In the present embodiment, bit signals of the bank refresh command REFSB in the FGR mode may be set to have a frequency which is eight times the frequency of the bit signal of the bank refresh command REFSB in the non-FGR mode. Because the count flag CNTF is generated once when the bank refresh command REFSB is generated eight times, the count flag CNTF may be uniformly generated even though the bank refresh command REFSB is generated to be eight times faster in the FGR mode as compared to the bank refresh command REFSB in the non-FGR mode.

Figure 26:
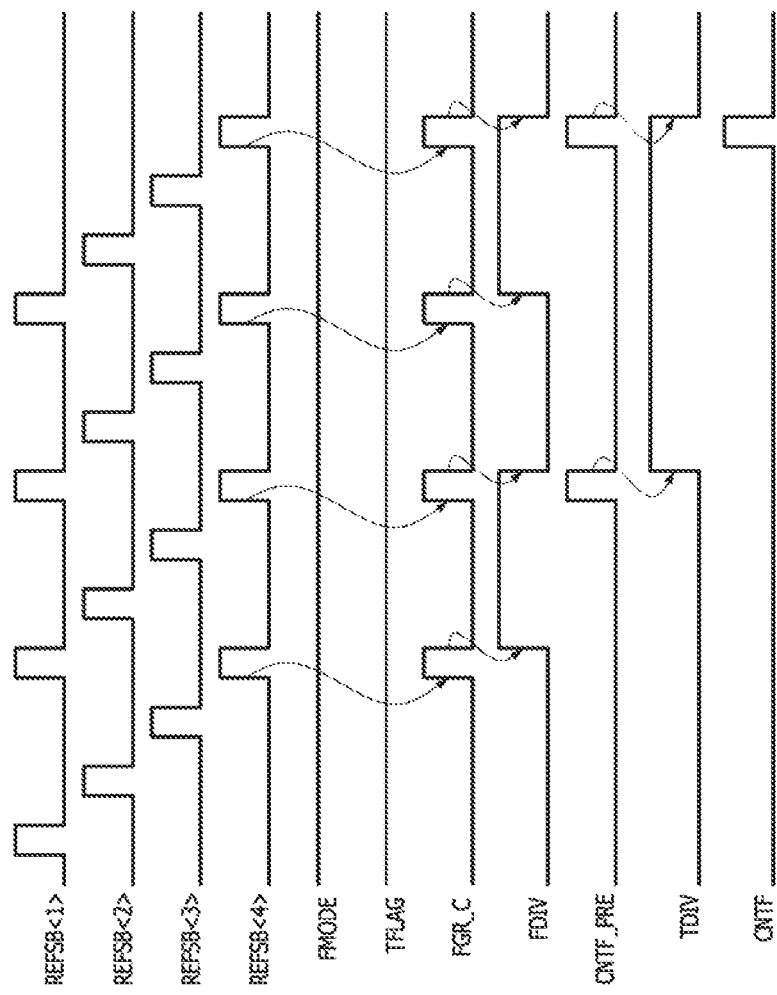

As illustrated in FIG. 26, the FGR command FGR_C may be generated when the first to fourth bit signals REFSB<1:4> of the bank refresh command REFSB are sequentially generated to perform the refresh operation for each of the first to $L^{th}$ memory banks 2131(1:L) while the mode signal FMODE has a logic "high" level to activate the FGR mode. The FGR division signal FDIV may be generated when the FGR command FGR_C is generated twice, and the pre-count flag CNTF_PRE may be generated when both of the FGR command FGR_C and the FGR division signal FDIV have a logic "high" level. The count flag CNTF may be generated by the temperature division signal TDIV and the pre-count flag CNTF_PRE when the pre-count flag CNTF_PRE is generated twice while the temperature flag TFLAG has a logic "high" level at a high temperature. In the present embodiment, the refresh command REF at a high temperature in the FGR mode may be set to have a frequency which is sixteen times a frequency of the refresh command REF at a low temperature in the non-FGR mode. Because the count flag CNTF is generated once when the refresh command REF is generated sixteen times, the count flag CNTF may be uniformly generated even though the refresh command REF is generated to be sixteen times faster at a high temperature in the FGR mode as compared to the refresh command REF at a low temperature in the non-FGR mode.

Figure 27:
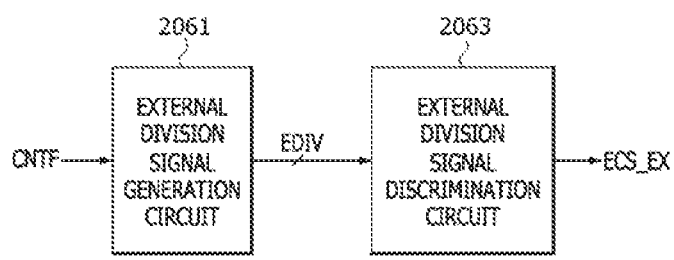
FIG. 27 is a block diagram, illustrating an external ECS command generation circuit included in the ECS command generation circuit illustrated in FIG. 17.

FIG. 27 is a block diagram, illustrating an example of the external ECS command generation circuit 2217. As illustrated in FIG. 27, the external ECS command generation circuit 2217 may include an external division signal generation circuit 2061 and an external division signal discrimination circuit 2063.

The external division signal generation circuit 2061 may divide the count flag CNTF to generate an external division signal EDW. The external division signal EDIV may be generated to include various division signals. For example, a first bit signal EDIV<1> of the external division signal EDIV may be generated to be a 2-division signal of the count flag CNTF, a second bit signal EDIV<2> of the external division signal EDIV may be generated to be a 4-division signal of the count flag CNTF, a third bit signal EDIV<3> of the external division signal EDIV may be generated to be a 8-division signal of the count flag CNTF, and a fourth bit signal EDIV<4> of the external division signal EDIV may be generated to be a 16-division signal of the count flag CNTF.

The external division signal discrimination circuit 2063 may generate the external ECS command ECS_EX when the bit signals of the external division signal EDIV that is inputted to the external division signal discrimination circuit 2063 have a predetermined logic level combination. For example, the external ECS command ECS_EX may be generated to have a logic "high" level when the count flag CNTF is generated fourteen times such that the first bit signal EDIV<1> of the external division signal EDIV is set to have a logic "low" level and all of the second to fourth bit signals EDIV<2:4> of the external division signal EDIV are set to have a logic "high" level.

Figure 28:
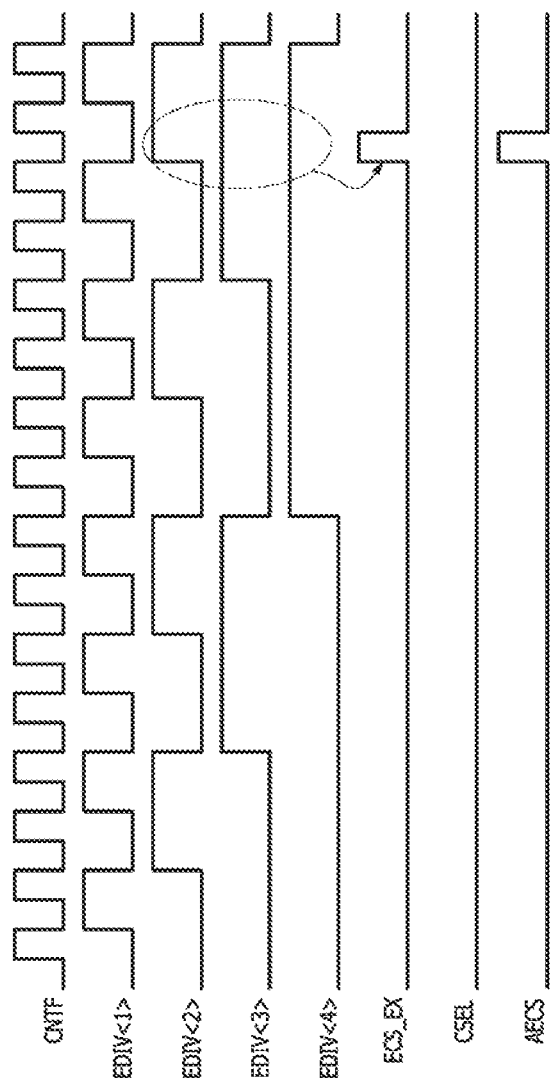
FIG. 28 is a timing diagram, illustrating an operation of the external ECS command generation circuit, illustrated in FIG. 27.

FIG. 28 is a timing diagram, illustrating an operation of the external ECS command generation circuit 2217. As illustrated in FIG. 28, when the count flag CNTF is generated fourteen times such that the first bit signal EDIV<1> of the external division signal EDIV is set to have a logic "low" level and all of the second to fourth bit signals EDIV<2:4> of the external division signal EDIV are set to have a logic "high" level, the external ECS command ECS_EX may be generated to have a logic "high" level. When the command selection signal CSEL has a logic "low" level, the external ECS command ECS_EX may be outputted as the ECS command AECS.

In the present embodiment, because the count flag CNTF is uniformly generated even in the FGR mode or even at a high temperature, the ECS operation performed according to the ECS command AECS may also be executed at regular intervals even in the non-FGR mode or even at a low temperature.

Figure 29:
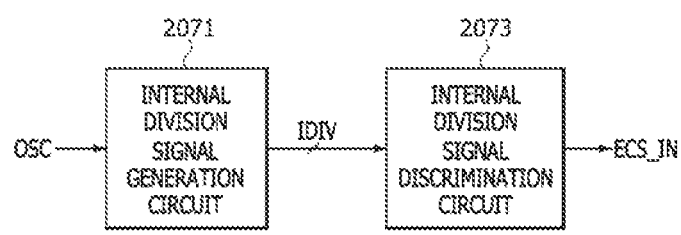
FIG. 29 is a block diagram, illustrating an internal ECS command generation circuit, included in the ECS command generation circuit illustrated in FIG. 17.

FIG. 29 is a block diagram illustrating an example of the internal ECS command generation circuit 2221. As illustrated in FIG. 29, the internal ECS command generation circuit 2221 may include an internal division signal generation circuit 2071 and an internal division signal discrimination circuit 2073.

The internal division signal generation circuit 2071 may divide the periodic signal OSC to generate an internal division signal IDIV. The internal division signal IDIV may be generated to include various division signals. For example, a first bit signal IDIV<1> of the internal division signal IDIV may be generated to be a 2-division signal of the periodic signal OSC, a second bit signal IDIV<2> of the internal division signal IDIV may be generated to be a 4-division signal of the periodic signal OSC, a third bit signal IDIV<3> of the internal division signal IDIV may be generated to be a 8-division signal of the periodic signal OSC, and a fourth bit signal IDIV<4> of the internal division signal IDIV may be generated to be a 16-division signal of the periodic signal OSC.

The internal division signal discrimination circuit 2073 may generate the internal ECS command ECS_IN when the bit signals of the internal division signal IDIV inputted to the internal division signal discrimination circuit 2073 have a predetermined logic level combination. For example, the internal ECS command ECS_IN may be generated to have a logic "high" level when a pulse of the periodic signal OSC is generated fourteen times such that the first bit signal IDIV<1> of the internal division signal IDIV is set to have a logic "low" level and all of the second to fourth bit signals IDIV<2:4> of the internal division signal IDIV are set to have a logic "high" level.

Figure 30:
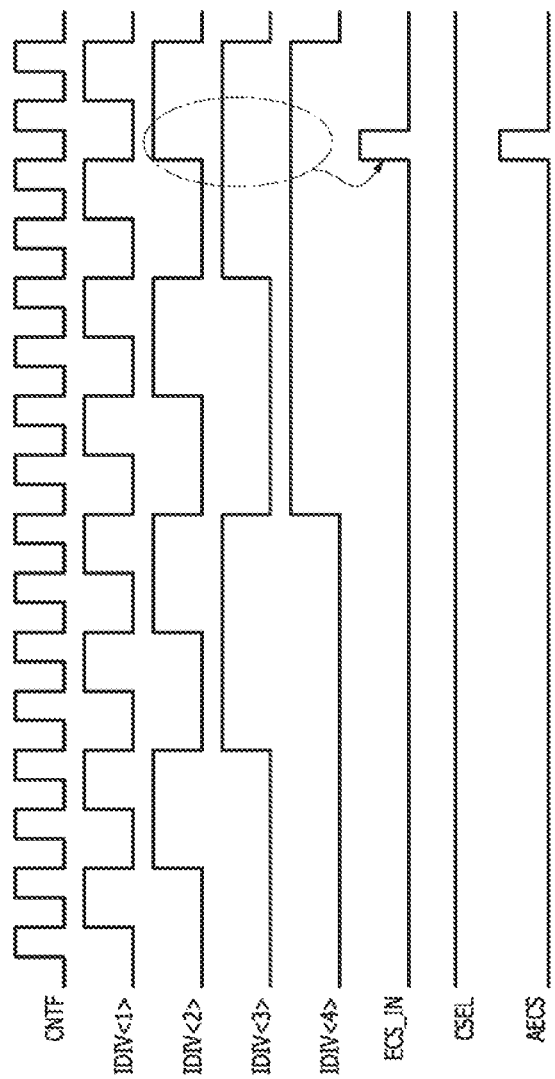
FIG. 30 is a timing diagram, illustrating an operation of the internal ECS command generation circuit, illustrated in FIG. 29.

FIG. 30 is a timing diagram, illustrating an operation of the internal ECS command generation circuit 2221. As illustrated in FIG. 30, when a pulse of the periodic signal OSC is generated fourteen times such that the first bit signal IDIV<1> of the internal division signal IDIV is set to have a logic "low" level and all of the second to fourth bit signals IDIV<2:4> of the internal division signal IDIV are set to have a logic "high" level, the internal ECS command ECS_IN may be generated to have a logic "high" level. When the command selection signal CSEL has a logic "high" level, the internal ECS command ECS_IN may be outputted as the ECS command AECS.

In the present embodiment, because the periodic signal OSC is uniformly generated regardless of the FGR mode or the temperature, the ECS operation that is performed according to the ECS command AECS may also be executed at regular intervals regardless of the FGR mode or the temperature.

Figure 31:
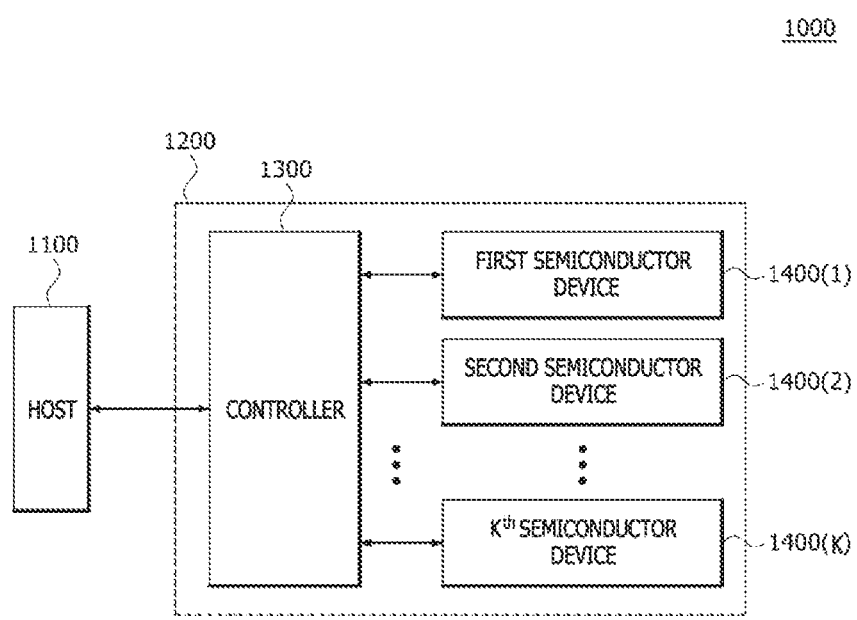
FIG. 31 is a block diagram, illustrating a configuration of an electronic system, according to an embodiment of the present disclosure.

FIG. 31 is a block diagram illustrating a configuration of an electronic system 1000 according to an embodiment of the present disclosure. As illustrated in FIG. 31, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the ECS operation based on the refresh command REF, the bank refresh command REFSB, and the single bank flag SB_C. Each of the semiconductor devices 1400(K:1) may perform the ECS operation at regular intervals even in the FGR mode or even at a high temperature. Each of the semiconductor devices 1400(K:1) may perform the ECS operation at regular intervals regardless of the FGR mode or the temperature.

Each of the semiconductor devices 1400(K:1) may include the semiconductor device 20 illustrated in FIG. 1 or the semiconductor device 2010 illustrated in FIG. 16. In some embodiments, each of the semiconductor devices 1400(K:1) may include any one of a dynamic random access memory (DRAM), a phase change random access memory (PRAM), a resistive random access memory (RRAM), a magnetic random access memory (MRAM), and a ferroelectric random access memory (FRAM).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor device comprising:
an error check and scrub (ECS) command generation circuit configured to generate an ECS command by controlling a speed of a first counting operation that is performed based on a refresh command or a bank refresh command, according to a temperature and a refresh mode of the semiconductor device, or configured to generate the ECS command by performing a second counting operation based on a periodic signal; and
an ECS control circuit configured to sequentially generate an ECS active command, an ECS read command, an ECS write command, an ECS pre-charge command, and an end signal based on the ECS command,
wherein the refresh mode includes a fine granularity refresh (FGR) mode, and the temperature includes a high temperature that is a temperature above a certain temperature.

2. The semiconductor device of claim 1, wherein a frequency of the refresh command in the FGR mode is set to be '2M' times a frequency of the refresh command in a non-FGR mode,
wherein the number 'M' is a natural number.

3. The semiconductor device of claim 1, wherein a frequency of the refresh command at the high temperature is set to be '2N' times a frequency of the refresh command at a non-high temperature,
wherein the number 'N' is a natural number.

4. The semiconductor device of claim 1, wherein the ECS command generation circuit generates the ECS command by performing the first counting operation when the refresh command is generated at a non-high temperature in a non-FGR mode.

5. The semiconductor device of claim 1, wherein the ECS command generation circuit generates the ECS command by performing the first counting operation when all bit signals of the refresh command or the bank refresh command are generated '2M' times at a non-high temperature in the FGR mode,
wherein the number 'M' is a natural number.

6. The semiconductor device of claim 1, wherein the ECS command generation circuit generates the ECS command by performing the first counting operation when the refresh command is generated '2N' times at the high temperature in a non-FGR mode,
wherein the number 'N' is a natural number.

7. The semiconductor device of claim 1, wherein the ECS command generation circuit generates the ECS command by performing the first counting operation whenever all of bit signals of the refresh command or the bank refresh command are generated '2M×2N' times at the high temperature in the FGR mode,
wherein the numbers 'M' and 'N' are natural numbers.

8. The semiconductor device of claim 1, wherein the ECS command generation circuit includes an FGR command generation circuit that is configured to generate an FGR command when all bit signals of the refresh command or the bank refresh command are generated in the FGR mode.

9. The semiconductor device of claim 8, wherein the ECS command generation circuit further includes a pre-count flag generation circuit that is configured to generate a pre-count flag when the refresh command is generated in a non-FGR mode or when the FGR command is generated '2M' times in the FGR mode.

10. The semiconductor device of claim 9, wherein the ECS command generation circuit is configured to terminate the generation of the pre-count flag when the ECS command is generated while a refresh operation for each of memory banks is performed.

11. The semiconductor device of claim 9, wherein the ECS command generation circuit further includes a count flag generation circuit that is configured to generate a count flag when the pre-count flag is generated at a non-high temperature or when the pre-count flag is generated '2N' times at the high temperature,
wherein the number 'N' is a natural number.

12. The semiconductor device of claim 11, wherein the ECS command generation circuit further includes:
an external ECS command generation circuit configured to count the count flag to generate an external ECS command; and an ECS command selection circuit configured to output the external ECS command as the ECS command based on a command selection signal.

13. The semiconductor device of claim 1, wherein the ECS command generation circuit includes:
an internal ECS command generation circuit configured to count the periodic signal to generate an internal ECS command; and
an ECS command selection circuit configured to output the internal ECS command as the ECS command based on a command selection signal.

14. A semiconductor device comprising:
an error check and scrub (ECS) command generation circuit configured to generate an ECS command by controlling a speed of a counting operation performed based on a refresh command or a bank refresh command, according to a temperature and a refresh mode of the semiconductor device; and
an ECS control circuit configured to sequentially generate an ECS active command, an ECS read command, an ECS write command, an ECS pre-charge command, and an end signal based on the ECS command,
wherein the refresh mode includes a fine granularity refresh (FGR) mode, and the temperature includes a high temperature over a certain temperature.

15. The semiconductor device of claim 14, wherein the ECS command generation circuit includes an FGR command generation circuit that is configured to generate an FGR command when all bit signals of the refresh command or the bank refresh command are generated in the FGR mode.

16. The semiconductor device of claim 15, wherein the ECS command generation circuit further includes a pre-count flag generation circuit that is configured to generate a pre-count flag when the refresh command is generated in a non-FGR mode or when the FGR command is generated '2M' times in the FGR mode.

17. The semiconductor device of claim 16, wherein the ECS command generation circuit is configured to terminate the generation of the pre-count flag when the ECS command is generated while a refresh operation for each of memory banks is performed.

18. The semiconductor device of claim 16, wherein the ECS command generation circuit further includes a count flag generation circuit that is configured to generate a count flag when the pre-count flag is generated at a non-high temperature or when the pre-count flag is generated '2N' times at the high temperature,
wherein the number 'N' is a natural number.

19. The semiconductor device of claim 18, wherein the ECS command generation circuit further includes:
an external ECS command generation circuit configured to count the count flag to generate an external ECS command; and
an ECS command selection circuit configured to output the external ECS command as the ECS command based on a command selection signal.

20. A semiconductor device comprising:
a fine granularity refresh (FGR) command generation circuit configured to generate an FGR command when all bit signals of the refresh command or the bank refresh command are generated in an FGR mode;
a pre-count flag generation circuit configured to generate a pre-count flag when the refresh command is generated in a non-FGR mode or when the FGR command is generated '2M' times in the FGR mode;
a count flag generation circuit configured to generate a count flag when the pre-count flag is generated at a low temperature, the low temperature being below a certain temperature, or when the pre-count flag is generated '2N' times at a high temperature, the high temperature being above the certain temperature;
an external ECS command generation circuit configured to count the count flag to generate an external ECS command; and
an ECS command selection circuit configured to output the external ECS command as an ECS command for controlling an ECS operation based on a command selection signal,
wherein the numbers 'M' and 'N' are natural numbers.

21. A semiconductor device comprising:
an error check and scrub (ECS) command generation circuit configured to generate an ECS command by performing a counting operation based on a periodic signal; and
an ECS control circuit configured to sequentially generate an ECS active command, an ECS read command, an ECS write command, an ECS pre-charge command, and an end signal based on the ECS command,
wherein the ECS command generation circuit includes an internal ECS command generation circuit configured to count the periodic signal to generate an internal ECS command, and an ECS command selection circuit configured to output the internal ECS command as the ECS command based on a command selection signal.

* * * * *